(12) United States Patent
Furutani

(10) Patent No.: US 8,897,049 B2
(45) Date of Patent: Nov. 25, 2014

(54) SEMICONDUCTOR DEVICE AND MEMORY DEVICE INCLUDING SEMICONDUCTOR DEVICE

(75) Inventor: Kazuma Furutani, Kanagawa (JP)

(73) Assignee: Semiconductor Energy Laboratories Co., Ltd., Atsugi-shi, Kanagawa (JP)

( * ) Notice: Subject to any disclaimer, the term of this patent is extended or adjusted under 35 U.S.C. 154(b) by 218 days.

(21) Appl. No.: 13/467,269

(22) Filed: May 9, 2012

(65) Prior Publication Data
US 2012/0287693 A1 Nov. 15, 2012

(30) Foreign Application Priority Data

May 13, 2011 (JP) ................... 2011-108767

(51) Int. Cl.
*G11C 15/04* (2006.01)
*G11C 14/00* (2006.01)
*G11C 27/02* (2006.01)

(52) U.S. Cl.
CPC .............. *G11C 15/04* (2013.01); *G11C 15/043* (2013.01); *G11C 14/00* (2013.01); *G11C 27/024* (2013.01); *G11C 15/046* (2013.01)
USPC ........................................ 365/49.17; 365/49.1

(58) Field of Classification Search
USPC ..................... 365/49.17, 49, 49.1; 257/43, 57
See application file for complete search history.

(56) References Cited

U.S. PATENT DOCUMENTS

| | | | |
|---|---|---|---|
| 4,466,081 A | 8/1984 | Masuoka | |
| 5,457,788 A | 10/1995 | Machida | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,304,477 B1 | 10/2001 | Naji | |
| 6,522,562 B2 | 2/2003 | Foss | |
| 6,563,174 B2 | 5/2003 | Kawasaki et al. | |
| 6,727,522 B1 | 4/2004 | Kawasaki et al. | |

(Continued)

FOREIGN PATENT DOCUMENTS

EP 1 737 044 A1 12/2006
EP 2 226 847 A2 9/2010

(Continued)

OTHER PUBLICATIONS

Eri Fukumoto et al.; "High Mobility Oxide Semiconductor TFT for Circuit Integration of AM-OLED"; IDW '10 : Proceedings of the 16th International Display Workshops; Dec. 1, 2010; pp. 631-634.

(Continued)

*Primary Examiner* — Richard Elms
*Assistant Examiner* — Mohammed A Bashar
(74) *Attorney, Agent, or Firm* — Fish & Richardson P.C.

(57) ABSTRACT

To provide a semiconductor device whose power can be turned off without the need for a peripheral circuit for data to escape temporarily and in which stored data is not lost even in an off state of the power of the device, and a memory device including the semiconductor device. In a holding circuit of the semiconductor device, a transistor that includes a semiconductor layer (at least a channel formation region) including an oxide semiconductor material with which small off-state current can be achieved is used. Further, the semiconductor device includes a switching element which enables a comparison circuit in which comparison between data stored in the holding circuit and reference data input from the outside does not need to be performed to become forcibly inactive.

21 Claims, 12 Drawing Sheets

(56) References Cited

U.S. PATENT DOCUMENTS

| | | |
|---|---|---|
| 6,873,532 B2 | 3/2005 | Foss |
| 6,888,730 B2 | 5/2005 | Foss et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,392 B2 | 9/2006 | Isobe et al. |
| 7,105,868 B2 | 9/2006 | Nause et al. |
| 7,148,092 B2 | 12/2006 | Isobe et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,737,506 B2 | 6/2010 | Isobe et al. |
| 7,749,818 B2 | 7/2010 | Isobe et al. |
| 7,795,734 B2 | 9/2010 | Isobe et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0176270 A1* | 11/2002 | Yanagawa .................. 365/49 |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101331 A1* | 5/2011 | Yamazaki et al. .............. 257/43 |
| 2012/0262979 A1 | 10/2012 | Matsubayashi |
| 2012/0273858 A1 | 11/2012 | Takahashi |

FOREIGN PATENT DOCUMENTS

| | | |
|---|---|---|
| JP | 60-198861 A | 10/1985 |
| JP | 63-096799 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-198186 A | 8/1993 |
| JP | 05-251705 A | 9/1993 |
| JP | 05-303896 A | 11/1993 |
| JP | 07-121444 A | 5/1995 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-373493 A | 12/2002 |
| JP | 2003-086000 A | 3/2003 |
| JP | 2003-086808 A | 3/2003 |
| JP | 2004-103957 A | 4/2004 |
| JP | 2004-525473 A | 8/2004 |
| JP | 2004-273614 A | 9/2004 |
| JP | 2004-273732 A | 9/2004 |
| JP | 2004-295967 A | 10/2004 |
| WO | 02/061755 A1 | 8/2002 |
| WO | 2004114391 A1 | 12/2004 |

OTHER PUBLICATIONS

Asakuma, N. et al., "Crystallization and Reduction of Sol—Gel—Derived Zinc Oxide Films by Irradiation With Ultraviolet Lamp," Journal of Sol—Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn—Doped Zinc Indium Oxide Thin Film Transistors for AMOLED Back-Plane," SID Digest '09 : SID International Symposium Digest of Technical Papers, May 31, 2009, pp. 280-283.

(56) References Cited

OTHER PUBLICATIONS

Clark, S et al., "First Principles Methods Using CASTEP," Zeitschrift fur Kristallographie, 2005, vol. 220, pp. 567-570.
Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPLUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using CG-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.
Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.
Kikuchi, H et al., "Polymer-Stabilized Liquid Crystal Blue Phases," Nature Materials, Sep. 1, 2002, vol. 1, pp. 64-68.
Kim, S et al., "High-Performance oxide thin film transistors passivated by various gas plasmas," The Electrochemical Society, 214th ECS Meeting, 2008, No. 2317, 1 page.
Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C.," Journal of Solid State Chemistry, 1985, vol. 60, pp. 382-384.
Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.
Kitzerow, H et al., "Observation of Blue Phases in Chiral Networks," Liquid Crystals, 1993, vol. 14, No. 3, pp. 911-916.
Kurokawa, Y et al., "UHF RFCPUS on Flexible and Glass Substrates for Secure RFID Systems," Journal of Solid-State Circuits , 2008, vol. 43, No. 1, pp. 292-299.
Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.
Lee, H et al., "Current Status of, Challenges to, and Perspective View of AM-OLED," IDW '06 : Proceedings of the 13th International Display Workshops, Dec. 7, 2006, pp. 663-666.
Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.
Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.
Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.
Meiboom, S et al., "Theory of the Blue Phase of Cholesteric Liquid Crystals," Phys. Rev. Lett. (Physical Review Letters), May 4, 1981, vol. 46, No. 18, pp. 1216-1219.
Miyasaka, M, "SUFTLA Flexible Microelectronics on Their Way to Business," SID Digest '07 : SID International Symposium Digest of Technical Papers, 2007, vol. 38, pp. 1673-1676.
Mo, Y et al., "Amorphous Oxide TFT Backplanes for Large Size AMOLED Displays," IDW '08 : Proceedings of the 6th International Display Workshops, Dec. 3, 2008, pp. 581-584.
Nakamura, "Synthesis of Homologous Compound with New Long-Period Structure," NIRIM Newsletter, Mar. 1995, vol. 150, pp. 1-4 with English translation.
Nakamura, M et al., "The phase relations in the In2O3—Ga2ZnO4—ZnO system at 1350°C.," Journal of Solid State Chemistry, Aug. 1, 1991, vol. 93, No. 2, pp. 298-315.
Nomura, K et al., "Thin-Film Transistor Fabricated in Single-Crystalline Transparent Oxide Semiconductor," Science, May 23, 2003, vol. 300, No. 5623, pp. 1269-1272.
Nomura, K et al., "Amorphous Oxide Semiconductors for High-Performance Flexible Thin-Transistors," Jpn. J. Appl. Phys. (Japanese Journal of Applied Physics) , 2006, vol. 45, No. 5B, pp. 4303-4308.
Nomura, K et al., "Room-Temperature Fabrication of Transparent Flexible Thin-Film Transistors Using Amorphous Oxide Semiconductors," Nature, Nov. 25, 2004, vol. 432, pp. 488-492.
Nomura, K et al., "Carrier transport in transparent oxide semiconductor with intrinsic structural randomness probed using single-crys-

(56) References Cited

OTHER PUBLICATIONS talline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)$_m$ (m>4):a Zn4s conductor ," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors By Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-IN. AMOLED Display with Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TF-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

* cited by examiner

| Dmem. (PBL) | Dref. (BL) | Tr.2 | Tr.3 | Tr.4 | Tr.5 | Comp1 | Comp2 |
|---|---|---|---|---|---|---|---|
| 0 | 0 | pass | × | × | pass | × | × |
| 1 | 0 | pass | pass | × | × | pass | × |
| 0 | 1 | × | × | pass | pass | × | pass |
| 1 | 1 | × | pass | pass | × | × | × |

(storage data: 1
reference data: 0)

(storage data: 1
reference data: 1)

(storage data: 0
reference data: 0)

(storage data: 0
reference data: 1)

FIG. 6A
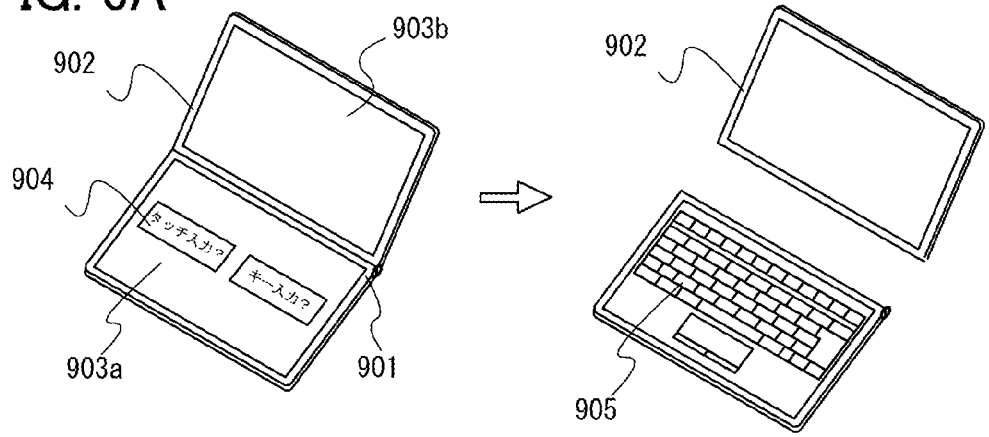
FIG. 6B
FIG. 6C
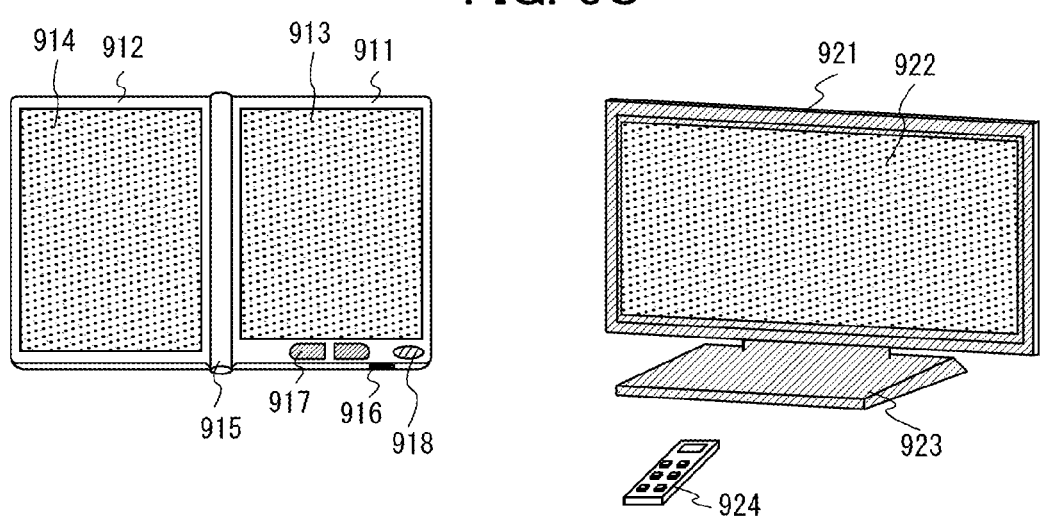
FIG. 6D
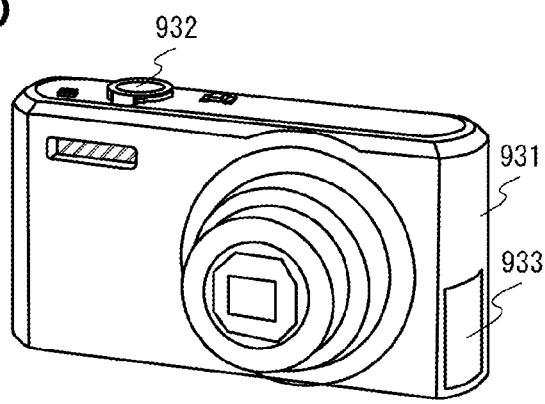

SEMICONDUCTOR DEVICE AND MEMORY DEVICE INCLUDING SEMICONDUCTOR DEVICE

BACKGROUND OF THE INVENTION

1. Field of the Invention

The present invention relates to a semiconductor device and a memory device including the semiconductor device.

2. Description of the Related Art

Memory devices are now used in products in a variety of fields. In a field where high-speed searching is required such as a communication field, a content addressable memory (CAM) is widely used.

The CAM is a type of memory which stores data in each of a plurality of memory cells (hereinafter also referred to as semiconductor devices) arranged in the memory and, when reference data is input thereto, compares the reference data with the stored data in each of the memory cells to find out whether they coincide with each other. Since the entire memory can be searched in one operation, significantly high-speed searching is possible by the CAM.

The CAM is, for example, used in a database system, a set associative cache memory, and the like, in which pattern matching operation is important. A cache memory is a memory which is capable of fast access and provided between a CPU featuring high-speed processing and low capacity and a main memory featuring low-speed processing and high capacity (generally, a DRAM is used). The cache memory is usually provided with a high-speed and low-capacity SRAM (e.g., Patent Document 1).

Recently, the demand for power-saving electronic equipments has been rapidly increased in the communication field as well; thus, a power-saving CAM is expected.

REFERENCE

Patent Document

[Patent Document 1] Japanese Published Patent Application No. H05-198186

SUMMARY OF THE INVENTION

As one of methods for achieving power saving of a CAM, there is a method in which in accordance with reference data input to the CAM, a memory cell in which comparison operation needs to be performed is set in an on state and a memory cell in which comparison operation does not need to be performed is set in an off state. However, since an SRAM, which is a conventional art, is volatile, when an off state (turning off) is made on the memory cell basis, a CAM based on the SRAM loses data stored in the memory cells. Accordingly, a peripheral circuit for the data stored in the memory cells to escape temporarily is necessary. Therefore, a problem such as an increase in the area and power consumption is caused. Further, owing to the volatility of the SRAM, there is also a problem in that data stored in memory cells is lost when power of the device is turned off during the operation.

In view of the above-described problems, it is an object of an embodiment of the present invention to provide a semiconductor device with reduced power consumption whose power can be turned off without the need for a peripheral circuit for data to escape temporarily and in which stored data is not lost even in an off state of the power of the device, and a memory device including the semiconductor device.

In the present invention, a circuit in which data in a semiconductor device is stored (hereinafter referred to as holding circuit) is formed using a transistor that includes a semiconductor layer (at least a channel formation region) including an oxide semiconductor material with which small enough off-state current can be achieved (hereinafter also referred to as an oxide semiconductor (OS) transistor or an OS transistor). The transistor can achieve extremely small leak current between a source electrode and a drain electrode in an off state (a state in which the voltage applied to a gate electrode is lower than or equal to the threshold voltage (also referred to as threshold potential or threshold value)), power consumption of the holding circuit can be reduced. In addition, because of the extremely small leak current between the source electrode and the drain electrode, data stored in the holding circuit can be prevented from being lost even when power of the device is turned off during data processing.

Further, in the present invention, a signal which forcibly makes a circuit that carries out comparison operation (hereinafter referred to as arithmetic circuit) inactive is input to a memory cell in which comparison operation between data stored in the holding circuit and reference data does not need to be performed. Thus, power consumption can be further reduced.

Specifically, an embodiment of the present invention is a semiconductor device which includes: a holding circuit including a first transistor configured to control input of storage data and a capacitor configured to store the storage data; a comparison circuit including a first arithmetic circuit and a second arithmetic circuit which are each configured to compare the storage data with reference data to find out whether the storage data coincides with the reference data; a switching element configured to control operation states of the first arithmetic circuit and the second arithmetic circuit; a first input signal line configured to input the storage data to the holding circuit; a second input signal line configured to input the reference data to the first arithmetic circuit and the second arithmetic circuit; a first control signal line configured to input an operation control signal to the first transistor; a second control signal line configured to input an operation control signal to the switching element; and an output signal line electrically connected to the first arithmetic circuit and the second arithmetic circuit through the switching element. A semiconductor layer of the first transistor contains an oxide semiconductor material. The holding circuit is electrically connected to the first arithmetic circuit and the second arithmetic circuit. If a conduction state of one transistor coincides with a conduction state of the other transistor (also referred to as an arithmetic result) in at least one of the first arithmetic circuit and the second arithmetic circuit and the switching element is in a conductive state, a potential of the output signal line changes.

In the above-described semiconductor device, the switching element may be a transistor including a semiconductor layer containing an oxide semiconductor material.

In the above-described semiconductor device, the first arithmetic circuit includes a second transistor and a third transistor having a different channel conductivity type from the second transistor. The second arithmetic circuit includes a fourth transistor having a different channel conductivity type from the second transistor and a fifth transistor having a different channel conductivity type from the fourth transistor. One of a source electrode and a drain electrode of the first transistor is electrically connected to the first input signal line. The other of the source electrode and the drain electrode of the first transistor is electrically connected to one electrode of the capacitor, a gate electrode of the third transistor, and a gate electrode of the fifth transistor. The other electrode of the capacitor is connected to a first fixed potential. A gate electrode of the second transistor and a gate electrode of the fourth transistor are electrically connected to the second input signal line. One of a source electrode and a drain electrode of the second transistor is electrically connected to the switching element. The other of the source electrode and the drain electrode of the second transistor is electrically connected to one of a source electrode and a drain electrode of the third transistor. The other of the source electrode and the drain electrode of the third transistor is electrically connected to a second fixed potential. One of a source electrode and a drain electrode of the fourth transistor is electrically connected to the switching element. The other of the source electrode and the drain electrode of the fourth transistor is electrically connected to one of a source electrode and a drain electrode of the fifth transistor. The other of the source electrode and the drain electrode of the fifth transistor is electrically connected to the second fixed potential. If a conduction state of one transistor coincides with a conduction state of the other transistor (also referred to as an arithmetic result) in at least one of the first arithmetic circuit and the second arithmetic circuit and the switching element is in a conductive state, a signal is output to the output signal line.

Another embodiment of the present invention is a memory device which includes semiconductor devices described above, which are arranged in a matrix, and a detection circuit configured to detect a change in the potential of the output signal line in any of the semiconductor devices. If a change in potential is detected by the detection circuit, the detection circuit outputs a first signal, and if a change in potential is not detected by the detection circuit, the detection circuit outputs a second signal which is different from the first signal.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit the function of the component. For example, an "electrode" can be used as part of "wiring", and vice versa. Further, the term "electrode" or "wiring" can also mean a combination of a plurality of "electrodes" and "wirings" formed in an integrated manner.

Functions of a "source" and a "drain" are sometimes replaced with each other when a transistor of opposite polarity is used or when the direction of current flow is changed in circuit operation, for example. Therefore, the terms "source" and "drain" can be used to denote the drain and the source, respectively, in this specification.

Note that in this specification and the like, an ordinal number such as "first" or "second" is given for convenience to distinguish elements, and is not given to limit the number, arrangement, and the order of steps.

Further, in this specification and the like, the term "electrically connected" includes the case where components are connected through an "object having any electric function." There is no particular limitation on the "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

In this specification and the like, when "one of a source and drain electrodes" functions as a source electrode, "the other of the source and drain electrodes" functions as a drain electrode.

A semiconductor device in which data stored in a memory cell is not lost even in an off state of the power of the device and in which an arithmetic circuit in a memory cell in which comparison operation does not need to be performed can be forcibly made inactive, and a memory device including the semiconductor device can be provided.

BRIEF DESCRIPTION OF THE DRAWINGS

In the accompanying drawings:

FIGS. 6A to 6D each illustrate an electronic device provided with a memory device according to an embodiment of the present invention;

DETAILED DESCRIPTION OF THE INVENTION

Figures 1A, 1B:
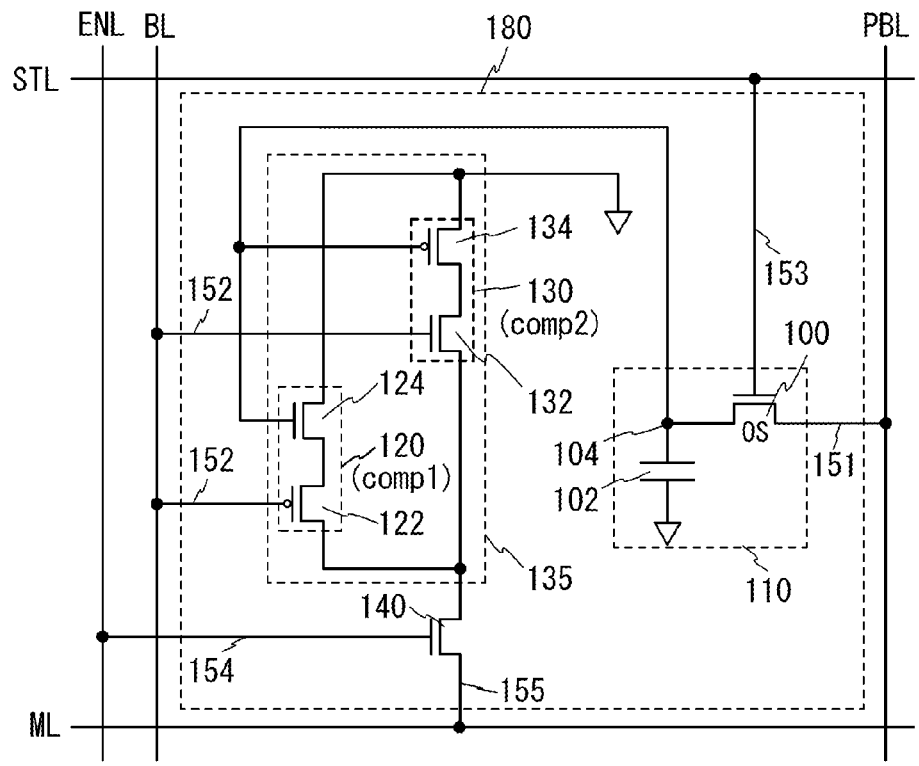
FIGS. 1A and 1B are diagrams showing a circuit configuration of a semiconductor device according to an embodiment of the present invention.
Figure 2A:
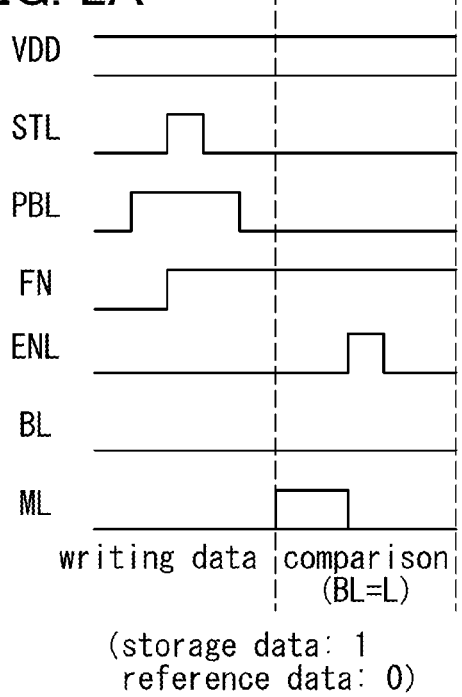
FIGS. 2A to 2D are examples of timing charts of a semiconductor device according to an embodiment of the present invention.
Figure 2B:
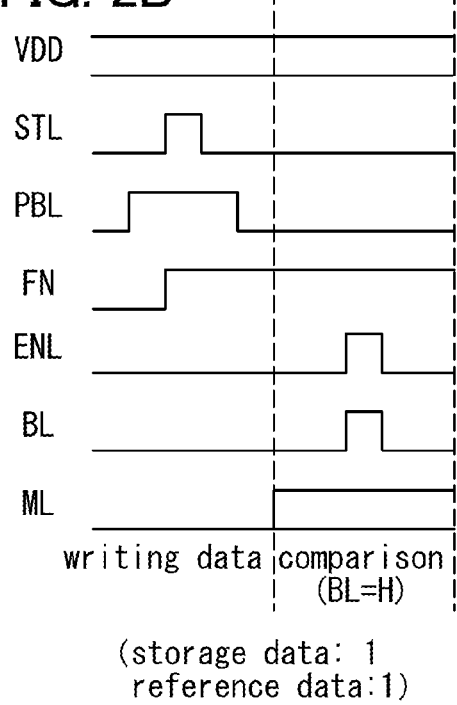
Figure 2C:
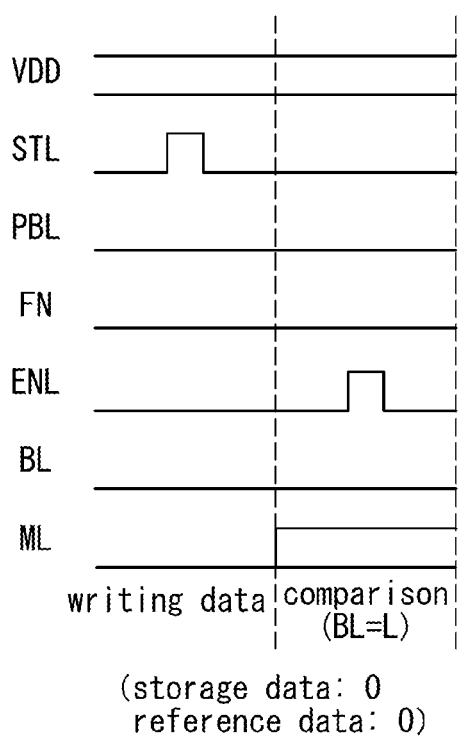
Figure 2D:
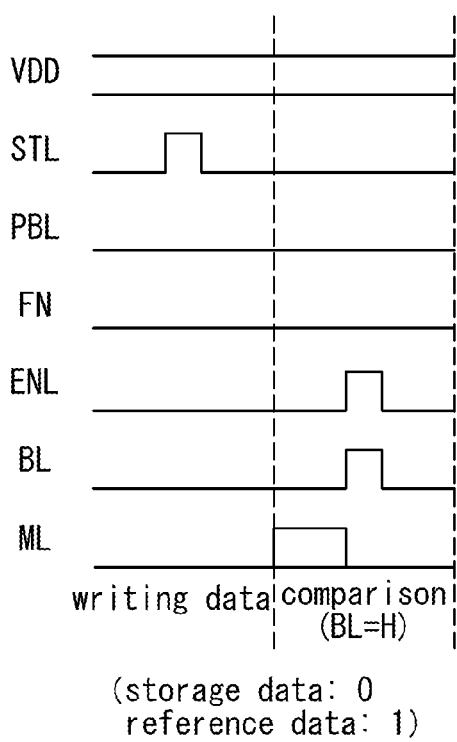

Hereinafter, embodiments of the invention disclosed herein will be described with reference to the drawings. Note that the present invention is not limited to the following description and it will be easily understood by those skilled in the art that modes and details can be modified in various ways without departing from the spirit and the scope of the present invention. Therefore, the present invention should not be construed as being limited to the description of the following embodiments.

Note that the position, the size, the range, or the like of each structure illustrated in drawings and the like is not accurately represented in some cases for easy understanding. Therefore, the invention disclosed herein is not necessarily limited to such position, size, range, and the like disclosed in the drawings and the like.

(Embodiment 1)

In this embodiment, an example of a circuit configuration of a semiconductor device according to an embodiment of the present invention will be described with reference to FIG. 1A, and operation states of transistors in a first arithmetic circuit and a second arithmetic circuit will be described with reference to FIG. 1B. In addition, examples of timing charts of a semiconductor device according to an embodiment of the present invention are shown in FIGS. 2A to 2D.

An example of a configuration and a manufacturing method of an OS transistor, which is employed in an embodiment of the present invention, will be described with reference to FIGS. 3A to 3D and FIGS. 4A to 4C.

<Circuit Configuration of Semiconductor Device in this Embodiment>

A circuit of a semiconductor device 180 capable of comparison operation between storage data (hereinafter also referred to as Dmem) and reference data (hereinafter also referred to as Dref) illustrated in FIG. 1A includes a holding circuit 110 including a first transistor 100 and a capacitor 102; a comparison circuit 135 including a first arithmetic circuit 120 that includes a second transistor 122 and a third transistor 124 and a second arithmetic circuit 130 that includes a fourth transistor 132 and a fifth transistor 134; a switching element 140; a first input signal line 151 (also referred to as programmable bit line PBL); a second input signal line 152 (also referred to as bit line BL); a first control signal line 153 (also referred to as store line STL); a second control signal line 154 (also referred to as enable line ENL); and an output signal line 155 (also referred to as match line ML).

One of a source and drain electrodes of the first transistor 100 is electrically connected to the first input signal line 151, and the first transistor 100 has a function of controlling input of a potential (charge) corresponding to storage data from the first input signal line 151 in accordance with the level of potential applied between a gate electrode and the source electrode through the first control signal line 153.

One electrode of the capacitor 102 is electrically connected to the other of the source and drain electrodes of the first transistor 100, and the other electrode of the capacitor 102 is electrically connected to a fixed potential (e.g., GND, 0 V, or the like). The capacitor 102 has a function of storing the potential (charge) corresponding to the storage data which is input from the first input signal line 151.

As a semiconductor layer in the first transistor 100, a layer including an oxide semiconductor material is used. Accordingly, the first transistor 100 has a characteristic of extremely small off-state current (leak current flowing between the source electrode and the drain electrode when the potential applied between the gate electrode and the source electrode is lower than or equal to the threshold voltage).

In the circuit configuration in this embodiment, the one electrode of the capacitor 102 is electrically connected to the other of the source and drain electrodes of the first transistor 100, a gate electrode of the third transistor 124, and a gate electrode of the fifth transistor 134. Accordingly, by making the first transistor 100 be in an off state (state in which the potential applied between the gate electrode and the source electrode is lower than or equal to the threshold voltage), the potential (charge) corresponding to the storage data which is stored in the capacitor 102 can be held for a long time. Thus, the holding circuit 110 can be regarded as a nonvolatile memory element. Since operation for constantly writing a potential (charge) corresponding to storage data (so-called refresh operation) or the like is unnecessary, power consumption of the memory device can be reduced.

Even in the case where the device is unintentionally powered off, for example, because of the power cut or the like, the first transistor 100 in the holding circuit 110 is brought into an off state (state in which the potential applied between the gate electrode and the source electrode is lower than or equal to the threshold voltage); accordingly, the potential (charge) corresponding to storage data which is stored in the capacitor 102 can be held for a long time.

A configuration and a manufacturing method of the first transistor 100 will be described in detail later.

The first arithmetic circuit 120 includes the second transistor 122 and the third transistor 124 having a different channel conductivity type from the second transistor 122 (i.e., in the case where the second transistor is a p-channel transistor (or p-type channel transistor), the third transistor 124 is an n-channel transistor (or n-type channel transistor)). The other of a source and drain electrodes of the second transistor 122 is electrically connected to one of a source and drain electrodes of the third transistor 124. One of the source and drain electrodes of the second transistor 122 is electrically connected to the switching element 140, and the other of the source and drain electrodes of the third transistor 124 is electrically connected to a fixed potential.

A gate electrode of the second transistor 122 is electrically connected to the second input signal line 152, and the gate electrode of the third transistor 124 is electrically connected to the other of the source and drain electrodes of the first transistor 100 and the one electrode of the capacitor 102. A potential (charge) corresponding to the reference data (Dref), which is applied to the second input signal line 152, is input to the gate electrode of the second transistor 122. A potential (charge) corresponding to the storage data (Dmem), which is stored in the holding circuit 110, is input to the gate electrode of the third transistor 124. The operation states of the respective transistors change in response to the corresponding potentials.

Note that the description is given in this specification on the assumption that the second transistor 122 is a p-channel transistor and the third transistor 124 is an n-channel transistor; however, the present invention is not limited thereto.

The second arithmetic circuit 130 includes the fourth transistor 132 having a different channel conductivity type from the second transistor 122 and the fifth transistor 134 having a different channel conductivity type from the fourth transistor 132 (i.e., in the case where the second transistor 122 is a p-channel transistor, the fourth transistor 132 is an n-channel transistor and the fifth transistor 134 is a p-channel transistor). The other of a source and drain electrodes of the fourth transistor 132 is electrically connected to one of a source and drain electrodes of the fifth transistor 134. One of the source and drain electrodes of the fourth transistor 132 is electrically connected to the switching element 140, and the other of the source and drain electrodes of the fifth transistor 134 is electrically connected to the fixed potential.

A gate electrode of the fourth transistor 132 is electrically connected to the second input signal line 152, and the gate electrode of the fifth transistor 134 is electrically connected to the other of the source and drain electrodes of the first transistor 100 and the one electrode of the capacitor 102. The potential (charge) corresponding to the reference data (Dref), which is applied to the second input signal line 152, is input to the gate electrode of the fourth transistor 132. The potential (charge) corresponding to the storage data (Dmem), which is stored in the holding circuit 110, is input to the gate electrode of the fifth transistor 134. The operation states of the transistors change in response to the corresponding potentials.

Note that the description is given in this specification on the assumption that the fourth transistor 132 is an n-channel transistor and the fifth transistor 134 is a p-channel transistor; however, the present invention is not limited thereto.

One terminal of the switching element 140 is electrically connected to the one of the source and drain electrodes of the second transistor 122 and the one of the source and drain electrodes of the fourth transistor 132. The other terminal of the switching element 140 is electrically connected to the output signal line 155. The switching element 140 has a function of electrically connecting the comparison circuit to the output signal line 155 when the switching element 140 is in an on state (conducting state). Note that the operation state of the switching element 140 is controlled by an electric signal input through the second control signal line 154.

The description so far is of the example of the circuit configuration of the semiconductor device according to this embodiment.

<Method for Driving Semiconductor Device According to this Embodiment>

"Writing operation" and "comparison operation" in a method for driving a semiconductor device according to this embodiment will be described with reference to FIGS. 1A and 1B. Note that "writing operation" refers to operation of writing the storage data (Dmem) in the holding circuit 110 through the first input signal line 151 and holding it therein, and "comparison operation" refers to operation of checking whether the storage data held in the holding circuit 110 coincides with the reference data (Dref) input from the second input signal line 152.

<Writing Operation>

In writing operation, comparison operation does not need to be performed. Therefore, a signal which makes the switching element 140 be in an off state (non-conducting state) (e.g., 0 V) is input to the switching element 140 through the second control signal line 154 to make the first arithmetic circuit 120 and the second arithmetic circuit 130 inactive (in a state in which current does not flow through the second transistor 122, the third transistor 124, the fourth transistor 132, and the fifth transistor 134 regardless of the potentials applied between the gate electrodes and source electrodes in the respective transistors). Thus, power consumption of the first arithmetic circuit 120 and the second arithmetic circuit 130 can be reduced. Although an analog switch is used as the switching element 140 in the circuit configuration in this embodiment, the OS transistor described above can also be employed as the switching element 140, in which case the first arithmetic circuit 120 and the second arithmetic circuit 130 can be inactive since the leak current in an off state is extremely small in the OS transistor.

Next, the potential of the first control signal line 153 is changed from low potential VL to high potential VH (potential higher than the threshold voltage of the first transistor 100) to turn on the first transistor 100 (or to make the first transistor 100 be in an on state), so that a potential (charge) corresponding to the storage data (Dmem), which is input from the first input signal line 151, is stored in the capacitor 102. In this manner, the storage data (Dmem) is written in the holding circuit 110. At this time, a floating node 104 (hereinafter also referred to as FN) of the memory cell also has the potential (charge) corresponding to the storage data (Dmem).

After the writing, the potential of the first control signal line 153 is changed from high potential VH to low potential VL to turn off the first transistor 100 (or to make the first transistor 100 be in an off state). Although the capacitor 102 is electrically connected to the first transistor 100, the third transistor 124, and the fifth transistor 134, the potential (charge) corresponding to the storage data stored in the capacitor 102 (floating node 104) is held for a long time owing to the fact that the leak current is extremely small in the first transistor 100 and in addition the leak current is extremely small as well in the third transistor 124 and the fifth transistor 134 because the gate electrodes of the third transistor 124 and the fifth transistor 134 are connected to the capacitor 102. Consequently, the storage data (Dmem) written in the holding circuit 110 can be held for a long time.

In the case where the device is unintentionally powered off because of the power cut or the like, the potential applied between the gate electrode and the source electrode of the first transistor 100 is 0 V, which causes the first transistor 100 to be in an off state. Accordingly, the potential (charge) corresponding to the storage data stored in the capacitor 102 is held in the holding circuit 110 without being erased.

Thus, the semiconductor device according to this embodiment is highly useful under a circumstance where the semiconductor device might be unintentionally powered off.

<Comparison Operation>

First, the output signal line 155 is precharged to power supply potential VDD (e.g., 5 V), and then the potential of the second control signal line 154 is changed from low potential VL to high potential VH to make the switching element 140 be in a conducting state. Accordingly, the first arithmetic circuit 120 and the second arithmetic circuit 130 become active, and as a result, the potential corresponding to the storage data (Dmem) (hereinafter also referred to as Vmem) is applied to the gate electrodes of the third transistor 124 and the fifth transistor 134.

At this time, if the storage data is high potential VH, the third transistor 124 is on and the fifth transistor 134 is off.

Next, a potential corresponding to the reference data (Dref) (hereinafter also referred to as Vref) is input to the second input signal line 152. Accordingly, the potential corresponding to the reference data (Vref) is applied to the gate electrodes of the second transistor 122 and the fourth transistor 132, which causes comparison operation between the storage data and the reference data to be performed in the first arithmetic circuit 120 and the second arithmetic circuit 130.

Here, how the reference data (Dref) and the storage data (Dmem) change the states of the second transistor 122, the third transistor 124, the fourth transistor 132, and the fifth transistor 134 and the states of the first arithmetic circuit 120 and the second arithmetic circuit 130 will be described with reference to FIG. 1B. Note that "Tr." in the drawing represents a transistor; for example, "Tr. 2" represents the second transistor 122.

When the value of the reference data (Dref) is "0" (e.g., when a potential of 0 V or a low potential is applied to the second input signal line 152) and the value of the storage data (Dmem) is "0" (e.g., when a potential of 0 V or a low potential is stored in the holding circuit 110), in other words, when the reference data coincides with the storage data, the second transistor 122 is in a conducting state (represented as "pass" in FIG. 1B), the third transistor 124 is in a non-conducting state (represented by "x" in FIG. 1B), the fourth transistor 132 is in a non-conducting state, and the fifth transistor 134 is in a conducting state. Accordingly, the first arithmetic circuit 120 and the second arithmetic circuit 130 are in a non-conducting state, and the output signal line 155 is not electrically connected to the fixed potential; therefore, the potential precharged at the output signal line 155 does not change.

When the value of the reference data (Dref) is "0" (e.g., when a potential of 0 V or a low potential is applied to the second input signal line 152) and the value of the storage data (Dmem) is "1" (e.g., when a potential of +3 V or a high potential is stored in the holding circuit 110), in other words, when the reference data does not coincide with the storage data, the second transistor 122 and the third transistor 124 are in a conducting state and the fourth transistor 132 and the fifth transistor 134 are in a non-conducting state. Accordingly, first arithmetic circuit 120 is in a conducting state, and the second arithmetic circuit 130 is in a non-conducting state, so that the output signal line 155 is electrically connected to the fixed potential. Therefore, the potential precharged at the output signal line 155 changes.

When the value of the reference data (Dref) is "1" (e.g., when a potential of +3 V or a high potential is applied to the second input signal line 152) and the value of the storage data (Dmem) is "0" (e.g., when a potential of 0 V or a low potential is stored in the holding circuit 110), in other words, when the reference data does not coincide with the storage data, the second transistor 122 and the third transistor 124 are in a non-conducting state and the fourth transistor 132 and the fifth transistor 134 are in a conducting state. Accordingly, the first arithmetic circuit 120 is in a non-conducting state, and the second arithmetic circuit 130 is in a conducting state, so that the output signal line 155 is electrically connected to the fixed potential. Therefore, the potential precharged at the output signal line 155 changes.

When the value of the reference data (Dref) is "1" (e.g., when a potential of +3 V or a high potential is applied to the second input signal line 152) and the value of the storage data (Dmem) is "1" (e.g., when a potential of +3 V or a high potential is stored in the holding circuit 110), in other words, when the reference data coincides with the storage data, the second transistor 122 and the fifth transistor 134 are in a non-conducting state and the third transistor 124 and the fourth transistor 132 are in a conducting state. Accordingly, the first arithmetic circuit 120 and the second arithmetic circuit 130 are in a non-conducting state, so that the output signal line 155 is not electrically connected to the fixed potential. Therefore, the potential precharged at the output signal line 155 changes.

Thus, by detecting whether the potential at the output signal line 155 is changed, it can be figured out whether the reference data (Dref) coincides with the storage data (Dmem).

Two arithmetic circuits (the first arithmetic circuit 120 and the second arithmetic circuit 130) as illustrated in FIG. 1A are used in this specification for the following reason.

For example, in the case where only one arithmetic circuit (the first arithmetic circuit 120) is included in the comparison circuit, when the storage data (Dmem) is "1" and the reference data (Dref) is "0", that is, when the storage data (Dmem) does not coincide with the reference data (Dref), the second transistor 122 and the third transistor 124 are both in the "pass" state as indicated by a dotted rectangle 160, which changes the potential precharged at the output signal line 155. Then, based on the change of the potential, it can be figured out whether the storage data (Dmem) coincides with the reference data (Dref).

Even in the case where the storage data (Dmem) does not coincide with the reference data (Dref) as in the above case, when the storage data (Dmem) is "0" and the reference data (Dref) is "1", the second transistor 122 and the third transistor 124 are both in the "x" state as indicated by a dotted rectangle 162 in FIG. 1B. Accordingly, the potential precharged at the output signal line 155 does not change.

In this manner, in the case where only one arithmetic circuit is used, when the storage data (Dmem) does not coincide with the reference data (Dref), malfunction (i.e., a correct comparison result is not output) is caused.

In contrast, when two arithmetic circuits (the first arithmetic circuit 120 and the second arithmetic circuit 130) are used together as in this embodiment, an arithmetic result of the first arithmetic circuit 120 and an arithmetic result of the second arithmetic circuit 130 are different (i.e., when the first arithmetic circuit 120 is in the "pass" state, the second arithmetic circuit 130 is in the "x" state, and when the first arithmetic circuit 120 is in the "x" state, the second arithmetic circuit 130 is in the "pass" state) as indicated by a dotted rectangle 164 in FIG. 1B. In this case, the above-described problem does not occur.

The above is description of an example of the driving method of a semiconductor device in this embodiment.

As in the example of the semiconductor device in this embodiment, when an OS transistor is used as the first transistor 100 provided in the holding circuit 110 which stores storage data, the leak current in the first transistor 100 can be suppressed to be extremely small; accordingly, variation of the data stored in the holding circuit 110 can be suppressed. Further, since the variation of the data stored in the memory cell can be suppressed, power supply can be stopped as appropriate while the data is held in the memory cell; thus, power consumption can be reduced.

In this embodiment, two arithmetic circuits (the first arithmetic circuit 120 and the second arithmetic circuit 130) and the switching element 140 that controls the active state of the two arithmetic circuits are used. The switching element 140 can be made to be in an off state in the case where operation in the arithmetic circuits does not need to be performed, which leads to suppression of the power consumption in the two arithmetic circuits. Accordingly, power consumption of the semiconductor device can be reduced.

It is preferable to use the OS transistor having extremely small leak current in an off state, which is described in this embodiment, as the switching element 140 because power consumption of the first arithmetic circuit 120 and the second arithmetic circuit 130 can be further suppressed.

The configuration, method, and the like described in this embodiment can be combined as appropriate with any of the configurations, methods, and the like described in the other embodiments.

(Embodiment 2)

In this embodiment, an example of a circuit configuration and a driving method of a memory device which uses the semiconductor device described in the above embodiment and can perform data discrimination of a plurality of bits will be described.

<Circuit Configuration of Memory Device>

Figure 5:
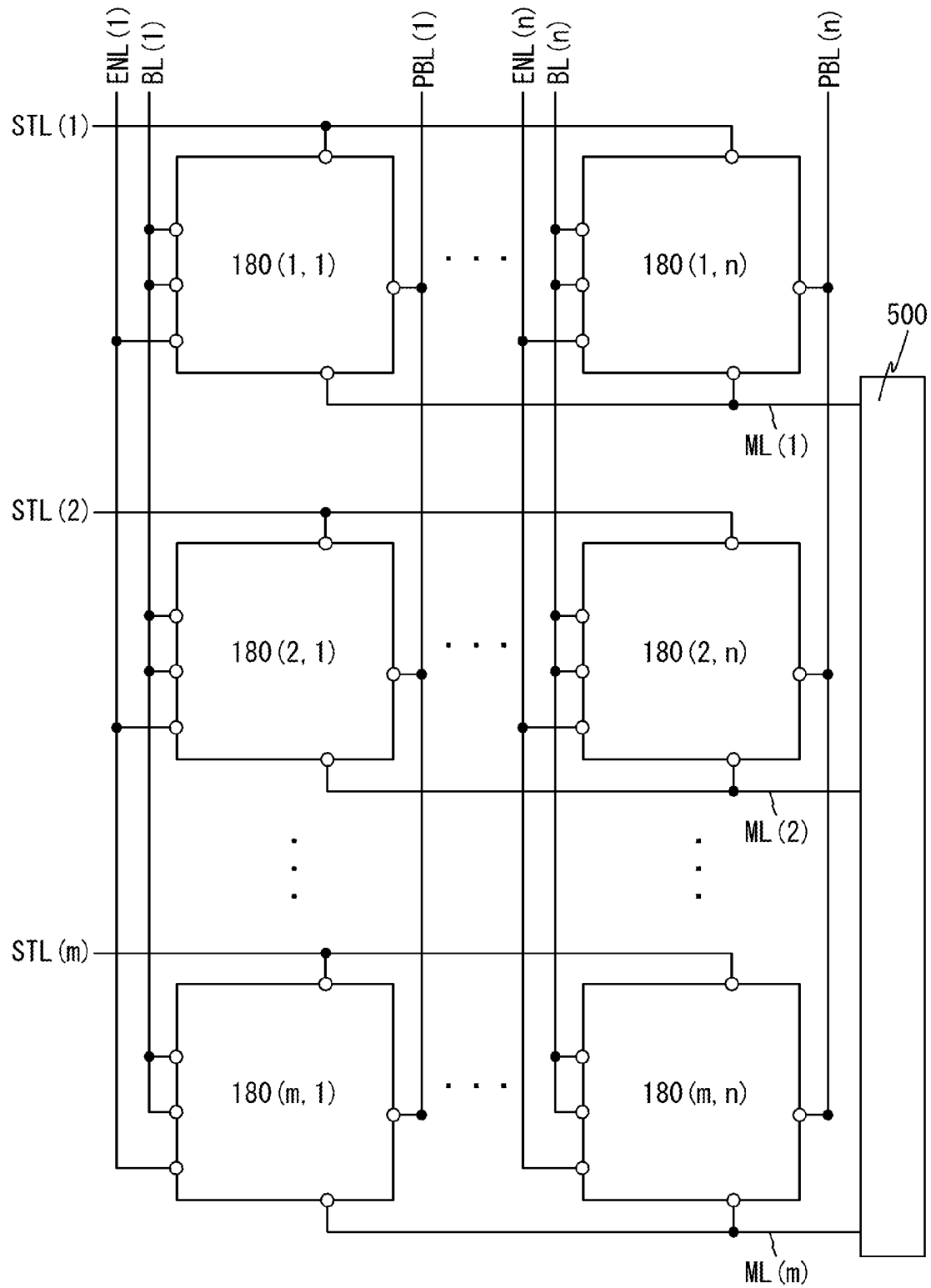
FIG. 5 illustrates a circuit configuration of a memory device according to an embodiment of the present invention.

An example of a circuit configuration of a memory device in this embodiment will be described with reference to FIG. 5. In FIG. 5, numeric values in parenthesis in each of semiconductor devices 180 represent a row and column. For example, 180(1,n) represents the semiconductor device 180 in the first row and the n-th column.

The memory device in FIG. 5 illustrates the concept of a CAMRAM in which the semiconductor devices 180 described in Embodiment 1 are provided (or arranged) in array. The CAMRAM is a memory device which detects whether reference data input from the outside coincides with storage data stored in all the semiconductor devices in a specific row.

In the memory device in FIG. 5, the semiconductor devices 180 are provided (or arranged) in m rows and n columns (m and n are natural numbers of 2 or more). The memory device in FIG. 5 is provided with n bit lines BL, n programmable bit lines PBL, n enable lines ENL, m store lines STL, m match lines ML, and a detection circuit 500.

The semiconductor device having the structure illustrated in FIG. 1A can be applied to each of the semiconductor devices 180 in m rows and n columns. The semiconductor device has a function of changing the potential of the match line ML connected to the output signal line 155 in response to the storage data input from the programmable bit line PBL through the first input signal line 151 and the reference data input from the bit line BL through the second input signal line 152.

Each of the n programmable bit lines PBL is electrically connected to each semiconductor device 180 in the same column. For example, the programmable bit line PBL(1) in the first column is electrically connected to the semiconductor devices 180(1,1) to 180(m,1) provided in the first column. Through the first input signal line 151 in each of the semiconductor devices, a potential corresponding to the storage data (Dmem) is supplied to the first transistor 100 in the holding circuit 110.

Each of the n bit lines BL is electrically connected to each semiconductor device 180 in the same column. For example, the bit line BL(1) in the first column is electrically connected to the semiconductor devices 180(1,1) to 180(m,1) provided in the first column. Through the second input signal line 152 in each of the semiconductor devices, a potential corresponding to the reference data (Dref) is supplied to the second transistor 122 and the fourth transistor 132.

Each of the n enable lines ENL is electrically connected to each semiconductor device 180 in the same column. For example, the enable line ENL(1) in the first column is electrically connected to the semiconductor devices 180(1,1) to 180(m,1) provided in the first column. Through the second control signal line 154 in each of the semiconductor devices, an electric signal (potential) which determines an operation state is supplied to the switching element 140.

Each of the m store lines STL is electrically connected to each semiconductor device 180 in the same row. For example, the store line STL(1) in the first column is electrically connected to the semiconductor devices 180(1,1) to 180(1,n) provided in the first row. Through the first control signal line 153 in each of the semiconductor devices, an electric signal (potential) which determines an operation state (on/off state) is supplied to the first transistor 100.

Each of the m match lines ML is electrically connected to each semiconductor device 180 in the same row. For example, the match line ML(1) in the first column is electrically connected to the semiconductor devices 180(1,1) to 180(1,n) provided in the first row. Each of the match lines ML is electrically connected to the detection circuit 500.

The detection circuit 500 has a function of detecting a change in potential at each match line ML. Specifically, the detection circuit 500 has a function of outputting a first signal (signal which tells a non-coincidence between storage data and reference data in at least one semiconductor device among a plurality of semiconductor devices that are electrically connected to one match line ML) to the outside in the case of detecting a change in the potential at the match line ML, and outputting a second signal that is different from the first signal (signal which tells a coincidence between storage data and reference data in all of the plurality of semiconductor devices that are electrically connected to one match line ML) to the outside in the case of not detecting a change in the potential at the match line ML. The detection circuit 500 also has a function of precharging the match lines ML to a predetermined potential.

The above is description of an example of the circuit configuration of the memory device according to this embodiment.

<Driving Method of Memory Device>

An example of a driving method of the memory device in this embodiment will be described.

First, low potential VL (e.g., 0 V) is applied to the n enable lines ENL to make arithmetic circuits in all the semiconductor devices 180 inactive. Then, a potential (charge) corresponding to storage data is applied to each of the n programmable bit lines PBL, and high potential (e.g., 5 V) is applied to the m store lines STL. In this manner, the potential (charge) corresponding to storage data is applied to the holding circuits 110 in the respective semiconductor devices. Then, low potential (e.g., 0 V) is applied to the m store lines STL, so that the potential (charge) corresponding to storage data is stored in the capacitors 102 in the holding circuits 110 (corresponding to the writing operation in Embodiment 1). As described in Embodiment 1, in the semiconductor devices 180, leak current is extremely small and leak of the potential (charge) corresponding to storage data is extremely small; accordingly, operation of periodically writing a potential (charge) corresponding to the storage data (i.e., refresh operation) or the like is unnecessary, which leads to a reduction in the power consumption of the memory device. Even when the device is unintentionally powered off because of the power cut or the like after the potential (charge) corresponding to storage data is stored in the capacitors 102, the first transistors 100 is brought in an off state (state in which the potential applied between the gate electrode and the source electrode is lower than or equal to the threshold voltage); accordingly, the potential (charge) corresponding to storage data stored in the capacitors 102 is not lost.

Next, the detection circuit 500 precharges the m match lines ML with a potential (e.g., 5 V), and then high potential (e.g., 5 V) is applied to the enable line ENL in the column in which comparison operation is performed to make the comparison circuits 135 in the column in which comparison operation needs to be performed active. The enable line ENL in the column in which comparison operation does not need to be performed keeps low potential (e.g., 0 V), and the comparison circuits 135 in the column can keep inactive; therefore, power consumption of the memory device can be reduced.

Next, a potential (charge) corresponding to reference data is applied to each of the n bit lines BL. Accordingly, in the semiconductor devices in which the comparison circuits 135 are in an active state, arithmetic operation for checking whether storage data coincides with reference data is performed in the comparison circuits 135 (corresponding to the comparison operation in Embodiment 1). In the semiconductor device in which reference data does not coincide with storage data, the potential of the output signal line 155 changes as in the comparison operation described in Embodiment 1.

Then, the detection circuit 500 detects whether potentials in the respective m match lines ML have changed (hereinafter this operation may also referred to as detection operation). For example, in the memory device including semiconductor devices of m rows and n columns as illustrated in FIG. 5, in the case where reference data does not coincide with storage data in the semiconductor device in the first row and the first column and the potential of the output signal line 155 in the semiconductor device 180(1,1) changes, the potential of the match line ML(1) in the first row changes. Accordingly, the detection circuit 500 decides that a non-coincidence between storage data and reference data occurs in at least one of the semiconductor devices 180(1,1) to 180(1,m) in the first row, and outputs the first signal (signal which tells a non-coincidence between storage data and reference data in at least one semiconductor device among a plurality of semiconductor devices that are electrically connected to one match line ML) to the outside. In the case where reference data coincides with storage data in all semiconductor devices in one row, the potential of the match line ML does not change; accordingly, the detection circuit 500 outputs the second signal that is different from the first signal (signal which tells a coincidence between storage data and reference data in all the plurality of semiconductor devices that are electrically connected to one match line ML) to the outside.

The above is description of an example of the driving method of a memory device in this embodiment.

(Embodiment 3)

In this embodiment, a manufacturing method of an OS transistor that is described in the above embodiment and can be applied to the first transistor 100 and the switching element 140 will be described below with reference to FIGS. 3A to 3D, and characteristics of the OS transistor will also be described.

Figure 3A:
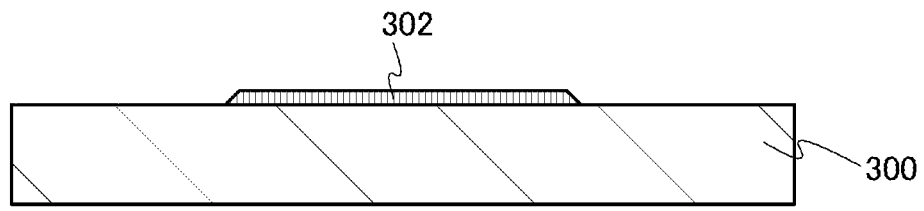
FIGS. 3A to 3D illustrate a structure and a manufacturing method of an OS transistor according to an embodiment of the present invention.

First, an oxide semiconductor layer 302 is formed over a substrate 300 (see FIG. 3A).

As the substrate 300, a glass substrate (e.g., a barium borosilicate glass substrate and an aluminoborosilicate glass substrate), a substrate formed of an insulator (e.g., a ceramic substrate, a quartz substrate, and a sapphire substrate), a crystallized glass substrate, a plastic substrate, or a semiconductor substrate (e.g., a silicon substrate) can be used for example.

A base layer may be formed over the substrate 300. The base layer prevents impurity diffusion from the substrate 300, and may be formed of silicon oxide ($SiO_2$), silicon nitride (SiN), silicon oxynitride (SiON), silicon nitride oxide (SiNO), aluminum oxide ($AlO_2$), aluminum nitride (AlN), aluminum oxynitride (AlON), aluminum nitride oxide (AlNO), or the like by a known method such as a CVD method such as a plasma CVD method, a PVD method, or a sputtering method. The base layer may have a single-layer structure or a stacked-layer structure. In the case of a stacked-layer structure, the base layer may be formed of a combination of the above films. There is no particular limitation on the thickness of the base layer; for example, the base layer preferably has a thickness of greater than or equal to 10 nm and less than or equal to 500 nm. When the thickness is less than 10 nm, the base layer might not be formed in some regions because of uneven thickness distribution within a substrate surface caused by a deposition apparatus. In addition, when the thickness is greater than 500 nm, deposition time and manufacturing cost might be increased.

The oxide semiconductor layer 302 may be formed in such a manner that an oxide semiconductor film is formed over the substrate 300 using a PVD method such as a sputtering method, a CVD method, or the like; a resist corresponding to a pattern shape into which the oxide semiconductor film is to be processed is formed over the oxide semiconductor film using a known technique such as a photolithography technique or an ink-jet method, and an unnecessary portion of the oxide semiconductor film is selectively removed using a known technique such as a dry etching method or a wet etching method.

In the case of employing dry etching as the etching method of the oxide semiconductor film, the etching gas is preferably a gas containing chlorine (a chlorine-based gas such as chlorine ($Cl_2$), boron trichloride ($BCl_3$), silicon tetrachloride ($SiCl_4$), or carbon tetrachloride ($CCl_4$)). Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

The thickness of the oxide semiconductor film is desirably larger than or equal to 3 nm and smaller than or equal to 30 nm. This is because the transistor might possibly be normally on when the oxide semiconductor film is too thick (e.g., the thickness is 50 nm or more).

It is preferable to form the oxide semiconductor film using a method in which impurities such as hydrogen, water, a hydroxyl group, or hydride do not easily enter the oxide semiconductor film. Therefore, a sputtering method or the like is preferably employed to form the oxide semiconductor film.

An oxide semiconductor used for forming the oxide semiconductor film preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main components and there is no particular limitation on the ratio of In to Ga and Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In: Ga: Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), In:Sn:Zn=2:1:5 (=1/4:1/8:5/8), or In:Sn:Zn=20:45:35, or any of oxides whose composition is in the neighborhood of the above compositions may be used.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In: Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The relative density of a metal oxide in the target is greater than or equal to 80%, preferably greater than or equal to 95%, further preferably greater than or equal to 99.9%. The use of a target with high relative density makes it possible to form an oxide semiconductor film with a dense structure.

However, the composition is not limited to those described above, and a material having an appropriate composition may be used in accordance with necessary semiconductor characteristics (such as mobility, threshold voltage, and variation). In order to obtain necessary semiconductor characteristics, it is preferable that the carrier density, the impurity concentration, the defect density, the atomic ratio of a metal element to oxygen, the bond distances between atoms, the density, and the like be set as appropriate.

For example, a high mobility is obtained with an In—Sn—Zn-based oxide (Eri Fukumoto, Toshiaki Arai, Narihiro Morosawa, Kazuhiko Tokunaga, Yasuhiro Terai, Takashige Fujimori, and Tatsuya Sasaoka, "High Mobility Oxide Semiconductor TFT for Circuit Integration of AM-OLED", IDW'10, pp. 631-634).

A transistor in which an oxide semiconductor containing In, Sn, and Zn as main components is used in a semiconductor layer (at least in a channel formation region) can have favorable characteristics by depositing the oxide semiconductor while heating a substrate or by performing heat treatment after the oxide semiconductor film is formed. Note that a main component refers to an element included in composition at 5 atomic % or more.

By intentionally heating the substrate during formation of the oxide semiconductor film including In, Sn, and Zn as main components, the field-effect mobility of the transistor can be improved. Further, the threshold voltage of the transistor can be positively shifted to make the transistor normally off.

The transistor in which an oxide semiconductor containing In, Sn, and Zn as main components is used in a semiconductor layer (at least in a channel formation region) is described above. Also in the case of a transistor in which an oxide semiconductor containing In, Ga, Zn as main components is used in a semiconductor layer (at least in a channel formation region), mobility can be increased by reducing the defect density in a bulk in the oxide semiconductor layer.

The oxide semiconductor layer 302 formed using the above-described oxide semiconductor is in a single crystal state, a polycrystalline (also referred to as polycrystal) state, an amorphous state, or the like.

The oxide semiconductor film is preferably a CAAC-OS (c-axis aligned crystalline oxide semiconductor) film. The specific structure of the CAAS-OS will be described in Embodiment 4.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, a mobility higher than that of an oxide semiconductor in an amorphous state can be obtained. In order to improve the surface flatness, the oxide semiconductor is preferably formed over a flat surface. Specifically, the oxide semiconductor is preferably formed over a surface with an average surface roughness ($R_a$) of less than or equal to 1 nm, preferably less than or equal to 0.3 nm.

Note that the average surface roughness ($R_a$) is obtained by expanding, into three dimensions, center line average roughness that is defined by JIS B 0601 so as to be able to apply it to a surface. $R_a$ can be expressed as an "average value of the absolute values of deviations from a reference surface to a designated surface" and is defined by the following formula.

$$Ra = \frac{1}{S_0} \int_{y_1}^{y_2} \int_{x_1}^{x_2} |f(x, y) - Z_0| dx dy \qquad \text{[FORMULA 1]}$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. $R_a$ can be measured using an atomic force microscope (AFM).

In forming the oxide semiconductor film by a sputtering method, for example, an object to be processed is held in a treatment chamber that is maintained under reduced pressure, and the object is heated to a temperature higher than or equal to 100° C. and lower than 550° C., preferably higher than or equal to 200° C. and lower than or equal to 400° C. Alternatively, the temperature of the object in forming the oxide semiconductor film may be room temperature. Then, moisture in the treatment chamber is removed, a sputtering gas from which hydrogen, water, or the like is removed is introduced, and the above-described target is used; thus, the oxide semiconductor film is formed. By forming the oxide semiconductor film while the object is heated, an impurity in the oxide semiconductor film, such as hydrogen or water, can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. Since an impurity such as moisture can be removed from the treatment chamber evacuated with a cryopump or the like, the concentration of an impurity in the oxide semiconductor film can be reduced.

The sputtering conditions are as follows, for example: the distance between the object and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform. The thickness of the oxide semiconductor film is greater than or equal to 1 nm and less than or equal to 50 nm, preferably greater than or equal to 1 nm and less than or equal to 30 nm, further preferably greater than or equal to 1 nm and less than or equal to 10 nm. With the oxide semiconductor film having such a thickness, a short-channel effect due to miniaturization can be suppressed. Note that the appropriate thickness of the oxide semiconductor film differs depending on the oxide semiconductor material, the intended use of the semiconductor device, or the like; therefore, the thickness can be determined as appropriate in accordance with the material, the intended use, or the like.

Note that before the oxide semiconductor film is formed by a sputtering method, reverse sputtering in which plasma is generated with an argon gas introduced is preferably performed so that a material attached to a surface where the oxide semiconductor film is to be formed is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

Note that the oxide semiconductor layer 302 deposited by the above-described method contains moisture or hydrogen (including a hydroxyl group) as an impurity in some cases. Moisture or hydrogen easily forms donor levels and thus serves as an impurity in the oxide semiconductor. Therefore, in order to reduce impurities such as moisture and hydrogen in the oxide semiconductor film (dehydrate or dehydrogenate the oxide semiconductor film), the oxide semiconductor film may be subjected to heat treatment for dehydration or dehydrogenation (hereinafter referred to as first heat treatment) in a reduced-pressure atmosphere, an inert gas atmosphere of nitrogen, a rare gas, or the like, an oxygen gas atmosphere, or the like.

By performing the first heat treatment on the oxide semiconductor layer 302, moisture or hydrogen in the oxide semiconductor layer 302 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for 3 to 6 minutes. When RTA is used for the heat treatment, dehydration or dehydrogenation can be performed in a short time; thus, treatment can be performed even at a temperature higher than the strain point of a glass substrate.

Note that the heat treatment apparatus is not limited to the electrical furnace, and may include a device for heating an object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with an object by heat treatment, such as nitrogen or a rare gas such as argon, is used.

In the first heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6 N (99.9999%) or higher, further preferably 7 N (99.99999%) or higher (i.e., the impurity concentration is preferably 1 ppm or lower, further preferably 0.1 ppm or lower).

Further, second heat treatment may be performed on the oxide semiconductor layer 302 which has been subjected to the first heat treatment. By performing the second heat treatment in an oxidizing atmosphere, oxygen is supplied to the oxide semiconductor layer 302; oxygen deficiency caused in the oxide semiconductor layer 302 by the first heat treatment is accordingly compensated. Thus, the second heat treatment may be referred to as oxygen supplying treatment. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the oxide semiconductor layer 302 can be increased; however, heat treatment for longer than 24 hours is not preferable because the productivity is lowered.

The oxidizing atmosphere is an atmosphere containing an oxidizing gas. The oxidizing gas is oxygen, ozone, nitrous oxide, or the like, and it is preferable that the oxidizing gas do not contain water, hydrogen, and the like. For example, the purity of oxygen, ozone, or nitrous oxide introduced into a heat treatment apparatus is 6 N (99.9999%) or higher, preferably 7 N (99.99999%) or higher (i.e., the impurity concentration is 1 ppm or lower, preferably lower than 0.1 ppm). As the oxidizing atmosphere, an oxidizing gas mixed with an inert gas may be used. In that case, the mixture contains an oxidizing gas at a concentration at least greater than or equal to 10 ppm. Further, an inert gas atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

By intentionally heating the substrate during the deposition and/or by performing heat treatment (including third heat treatment described later as well as the first and second heat treatments) after deposition, hydrogen, a hydroxyl group, or moisture can be released and removed from the oxide semiconductor film and oxygen deficiency in the oxide semiconductor film can be compensated; accordingly, an effect of increasing electric field mobility can be expected. This increase in electric field mobility is presumed to be achieved not only by removal of impurities by dehydration or dehydrogenation or by compensation of oxygen deficiency but also by a reduction in interatomic distance due to an increase in density. The oxide semiconductor can be crystallized by being purified by removal of impurities from the oxide semiconductor.

The intentional heating of the substrate during deposition and/or the heat treatment after the deposition contributes not only to improving field-effect mobility but also to making the transistor normally off. In a transistor which uses an oxide semiconductor including In, Sn, Zn as main components in a semiconductor layer (at least in a channel formation region) and is formed without unintentional heating of the substrate, the threshold voltage tends to be shifted in the negative direction. However, in the case of using an oxide semiconductor film formed with intentional heating of the substrate (at a temperature of 150° C. or higher, preferably 200° C. or higher, and further preferably 400° C. or higher), it is observed that the negative shift of the threshold voltage is prevented and the threshold voltage is shifted so that the transistor becomes normally off.

By intentionally heating the substrate during deposition and/or by performing heat treatment after the deposition, the stability against a gate-bias stress can be increased.

Note that the threshold voltage can also be controlled by changing the ratio of In to Sn and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

A non-single-crystal oxide semiconductor purified by intentionally heating the substrate during deposition and/or by performing heat treatment after the deposition is expected to ideally achieve a field-effect mobility exceeding 100 cm$^2$/Vsec.

Either after deposition of the oxide semiconductor film or after formation of the oxide semiconductor layer 302, oxygen supplying treatment may be performed on the oxide semiconductor layer 302 (or the oxide semiconductor film); heat treatment may be performed to release hydrogen, a hydroxyl group, or moisture from the oxide semiconductor; and the oxide semiconductor may be crystallized by the heat treatment or by later heat treatment. By such crystallization treatment or recrystallization treatment, a non-single crystal oxide semiconductor having favorable crystallinity can be obtained.

Here, the "oxygen supplying treatment" means that oxygen (which includes at least one of an oxygen radical, an oxygen atom, and an oxygen ion) is added to a bulk of the oxide semiconductor layer 302 (or the oxide semiconductor film). Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. By the oxygen doping treatment, oxygen can be included in the oxide semiconductor layer 302 or a gate insulating layer 306 more than that in the stoichiometric composition.

The oxygen doping treatment is preferably performed by an inductively coupled plasma (ICP) method, using oxygen plasma which is excited by a microwave (with a frequency of 2.45 GHz, for example).

The supply of an oxygen ion to the oxide semiconductor film can be referred to as oxygen supplying treatment for replenishing oxygen in the oxide semiconductor film as well as the second heat treatment. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

Figure 3B:
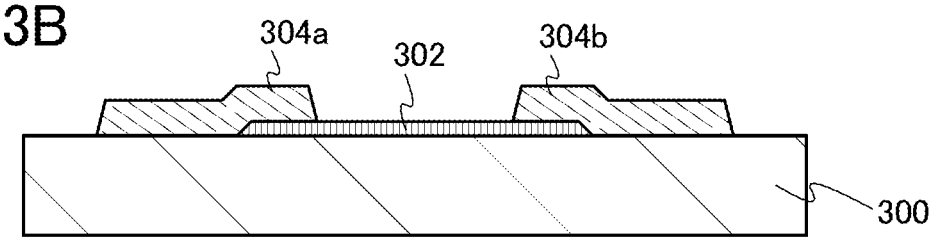

Next, a source electrode (or drain electrode) 304a and a drain electrode (or source electrode) 304b are formed over the substrate 300 and the oxide semiconductor layer 302 (see FIG. 3B).

A method for forming the source electrode (or drain electrode) 304a and the drain electrode (or source electrode) 304b may be as follows: a conductive layer is formed over the substrate 300 or the oxide semiconductor layer 302 by a PVD method such as resistance-heating evaporation or sputtering, a resist corresponding to a pattern shape into which the conductive layer is to be processed is formed over the conductive layer by a known technique such as a photolithography technique or an ink-jet method, and an unnecessary portion of the conductive layer is selectively removed by a known technique such as a dry etching method or a wet etching method. As a material of the conductive layer, an element selected from aluminum, chromium, copper, tantalum, titanium, molybdenum, tungsten, manganese, magnesium, zirconium, beryllium, neodymium, and scandium; an alloy containing any of the elements as a main component; or the like can be used.

Note that the conductive layer may have a single-layer structure or a stacked structure of two or more layers. For example, a single-layer structure of a titanium film or a titanium nitride film, a two-layer structure in which a titanium film is stacked over an aluminum film, a two-layer structure in which a titanium film is stacked over a titanium nitride film, a three-layer structure in which an aluminum film is sandwiched between titanium films, a three-layer structure in which an aluminum film is sandwiched between molybdenum films, and the like can be given.

Alternatively, the conductive layer may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is included can be used.

Figure 3C:
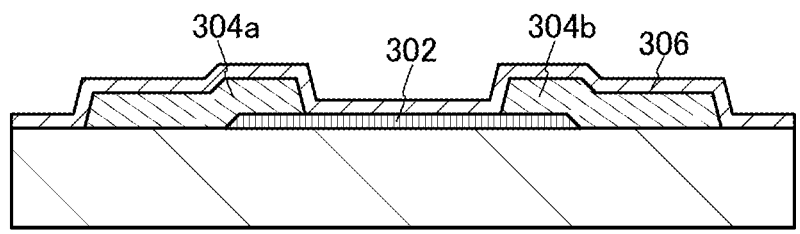

Next, the gate insulating layer 306 is formed over the oxide semiconductor layer 302, the source electrode (or drain electrode) 304a, and the drain electrode (or source electrode) 304b (see FIG. 3C).

The gate insulating layer 306 may be formed in the following manner: an insulating film is formed over the oxide semiconductor layer 302, the source electrode (or drain electrode) 304a, and the drain electrode (or source electrode) 304b by a PVD method, a CVD method, or the like. Although the gate insulating layer 306 is not subjected to pattern formation treatment in FIG. 3C, in the case of performing pattern formation treatment, the following method may be used: a resist corresponding to a pattern shape into which the insulating film is to be processed is formed, and an unnecessary portion of the insulating film is selectively removed by a known technique such as a dry etching method or a wet etching method.

As a material of the insulating film, a material such as silicon oxide, silicon nitride, or silicon oxynitride can be used. The gate insulating layer 306 can be formed using a material including a Group 13 element and oxygen. As the material including a Group 13 element and oxygen, for example, gallium oxide, aluminum oxide, aluminum gallium oxide, or the like can be used. The gate insulating layer 306 may be formed so as to include tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 306 may have a single-layer structure or a stacked structure in which these materials are combined.

There is no particular limitation on the thickness of the gate insulating layer 306; however, in the case of forming a miniaturized transistor, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm. For example, the gate insulating layer 306 may be formed using a stacked insulating film in which 10-nm-thick aluminum oxide is formed over 30-nm-thick silicon oxide.

The gate insulating layer 306 is preferably formed using a film that is formed by a method with which impurities such as hydrogen or water do not enter the gate insulating layer 306. This is because, when impurities such as hydrogen or water are included in the gate insulating layer 306, the impurities such as hydrogen or water enter the oxide semiconductor layer 302 formed in the previous step or oxygen in the oxide semiconductor layer 302 is extracted by the impurities such as hydrogen or water, so that a channel of the oxide semiconductor layer 302 might have lower resistance (have n-type conductivity) and a parasitic channel might be formed. For this reason, the gate insulating layer 306 is preferably formed so as not to include impurities such as hydrogen or water. For example, the gate insulating layer 306 is preferably formed by a sputtering method. It is preferable to use a high-purity gas from which impurities such as hydrogen or water are removed, as a sputtering gas used for formation of the gate insulating layer 306.

Many of oxide semiconductor materials that can be used for the oxide semiconductor layer 302 include a Group 13 element. Therefore, in the case where the gate insulating layer 306 in contact with the oxide semiconductor layer 302 is formed using a material including a Group 13 element and oxygen, the state of the interface between the oxide semiconductor layer 302 and the gate insulating layer 306 can be kept favorable. This is because the material including a Group 13 element and oxygen which is used for the gate insulating layer 306 is well matched with an oxide semiconductor material used for the oxide semiconductor layer 302. For example, when the gate insulating layer 306 including gallium oxide is provided in contact with the oxide semiconductor layer 302, pileup of hydrogen at the interface between the oxide semiconductor layer 302 and the gate insulating layer 306 can be reduced.

The gate insulating layer 306 is preferably formed using aluminum oxide through which water is not easily transmitted, in terms of preventing entry of moisture to the oxide semiconductor layer 302. In addition, since aluminum oxide has a property of not easily penetrating oxygen, release of oxygen (including excess oxygen) contained in the gate insulating layer 306 to a gate electrode 308 side by third heat treatment performed later can be suppressed; accordingly, oxygen deficiency in the oxide semiconductor layer 302 can be effectively compensated.

When the gate insulating layer 306 is thin as described above, gate leakage due to a tunneling effect or the like becomes a problem. In order to solve the problem of gate leakage, the gate insulating layer 306 may be formed using a high dielectric-constant (high-k) material such as hafnium oxide, tantalum oxide, yttrium oxide, hafnium silicate (Hf-Si$_x$O$_y$ (x>0, y>0)), hafnium silicate (HfSi$_x$O$_y$ (x>0, y>0)) to which nitrogen is added, or hafnium aluminate (HfAl$_x$O$_y$ (x>0, y>0)) to which nitrogen is added. By using a high-k material for the gate insulating layer 306, the thickness thereof can be increased for suppression of gate leakage with favorable electric characteristics of the gate insulating layer 306 maintained. Note that a stacked structure of a film containing a high-k material and a film containing any one of silicon oxide, silicon nitride, silicon oxynitride, silicon nitride oxide, aluminum oxide, and the like may be employed.

In addition, the gate insulating layer 306 preferably includes oxygen more than that in the stoichiometric composition. For example, when silicon oxide is used for the gate insulating layer 306, the stoichiometric composition can be expressed as SiO$_{2+\alpha}$ (0<α<1). Further, when the gate insulating layer 306 is formed using gallium oxide, the stoichiometric composition can be expressed as Ga$_2$O$_{3+\alpha}$ (0<α<1). Furthermore, when aluminum oxide is used, the stoichiometric composition can be expressed as Al$_2$O$_{3+\alpha}$ (0<α<1). When gallium aluminum oxide is used, the stoichiometric composition can be expressed as Ga$_x$Al$_{2-x}$O$_{3+\alpha}$ (0<x<2, 0<α<1).

After formation of the gate insulating layer 306 (or after formation of an insulating film used for forming the gate insulating layer 306), oxygen supplying treatment may be performed on the gate insulating layer 306 (the insulating film used for forming the gate insulating layer 306). At the same time as the oxygen supplying treatment on the gate insulating layer 306 (or the insulating film used for forming the gate insulating layer 306), the oxygen supplying treatment on the oxide semiconductor layer 302 may be performed.

After the gate insulating layer 306 is formed, third heat treatment is preferably performed in an inert gas atmosphere or an oxygen atmosphere. The third heat treatment is preferably performed at a temperature higher than or equal to 200° C. and lower than or equal to 450° C., preferably higher than or equal to 250° C. and lower than or equal to 350° C. For example, the heat treatment may be performed at 250° C. for 1 hour in a nitrogen atmosphere. By performing the third heat treatment, variation in electric characteristics of the transistor can be reduced. Moreover, in the case where a film in contact with the oxide semiconductor layer 302 (e.g., the gate insulating layer 306) includes oxygen, oxygen can be supplied to the oxide semiconductor layer 302 to fill oxygen vacancies in the oxide semiconductor layer 302, whereby an i-type (intrinsic) or substantially i-type oxide semiconductor layer can be formed. In the case where a base film containing oxygen or the like is provided in contact with the oxide semiconductor layer 302, oxygen can also be supplied from the base film side to fill oxygen vacancies.

Note that although the third heat treatment is performed in this embodiment after the gate insulating layer 306 is formed, the timing of performing the third heat treatment is not limited thereto. For example, the third heat treatment may be performed after formation of the gate electrode 308 or formation of a conductive film used for forming the gate electrode 308.

By performing the third heat treatment as described above, the oxide semiconductor layer 302 can be purified so as to include the substance including a hydrogen atom as little as possible.

Figure 3D:
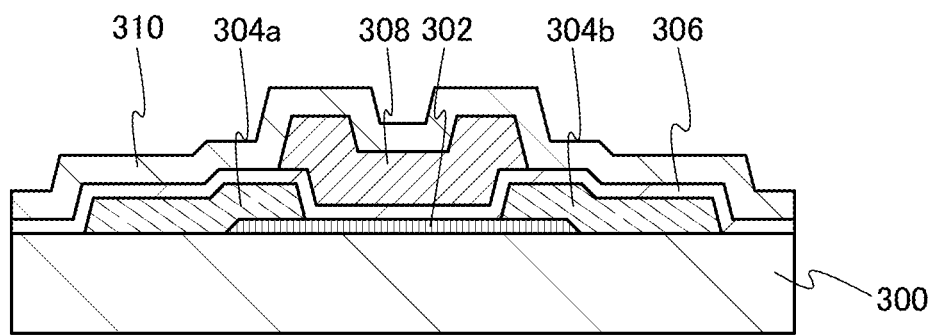

Next, the gate electrode 308 is formed over the gate insulating layer 306 (see FIG. 3D).

A method for forming the gate electrode 308 may be as follows: a conductive film is formed over the gate insulating layer 306 by a PVD method such as resistance-heating evaporation or sputtering, a resist corresponding to a pattern shape into which the conductive layer is to be processed is formed over the conductive film by a known technique such as a photolithography technique or an ink-jet method, and an unnecessary portion of the conductive film is selectively removed by a known technique such as a dry etching method or a wet etching method.

As examples of a material of the conductive film, a metal material such as molybdenum, titanium, tantalum, tungsten, aluminum, copper, neodymium, magnesium, or scandium or an alloy material containing any of these materials as a main component can be used. The gate electrode 308 may have a single-layer structure or a stacked structure including a combination of the above materials.

Although the thickness of the gate electrode 308 is not particularly limited, the excessively large thickness leads to a reduction in productivity of the semiconductor device; accordingly, the thickness is preferably greater than or equal to 10 nm and less than or equal to 1000 nm, and further preferably greater than or equal to 50 nm and less than or equal to 500 nm. For example, the gate electrode 308 may be formed using a stacked conductive film in which 300-nm-thick aluminum is formed over 100-nm-thick titanium.

Through the above-described process, the OS transistor that can be applied to the first transistor 100 and the switching element 140 in this embodiment is completed. After formation of the gate electrode 308, an insulating film 310 may be formed over the gate insulating layer 306 and the gate electrode 308 as illustrated in FIG. 3D.

Figure 4A:
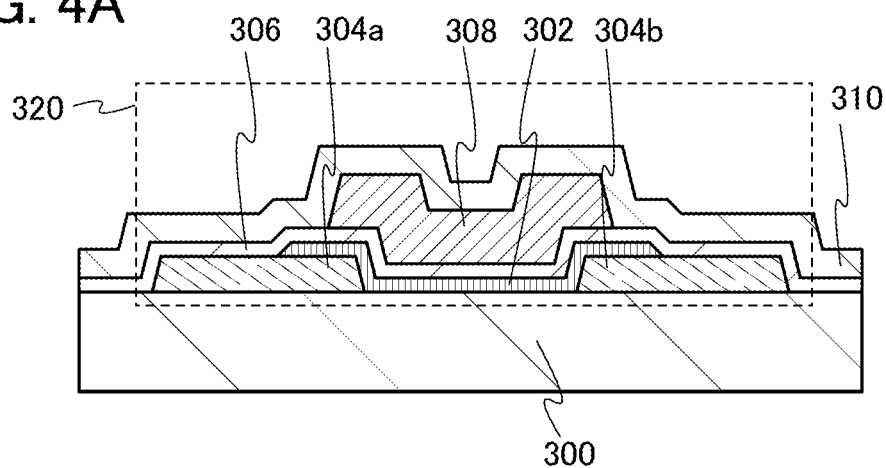
FIGS. 4A to 4C illustrate a structure of an OS transistor according to an embodiment of the present invention.
Figure 4B:
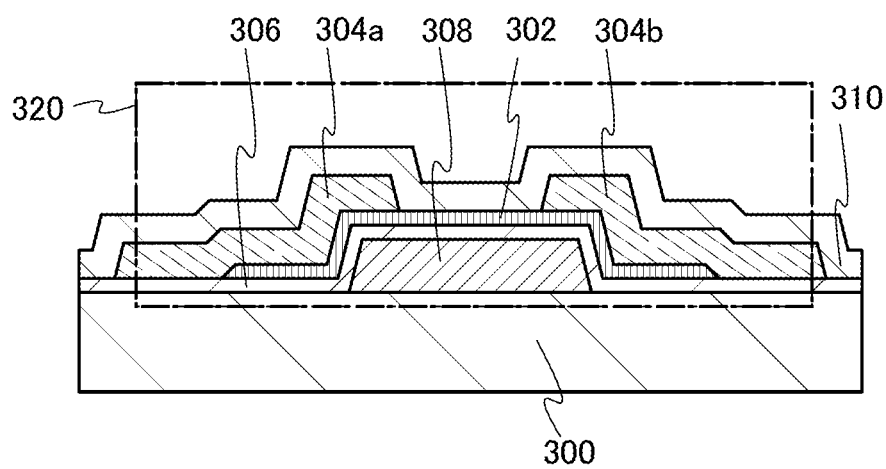
Figure 4C:
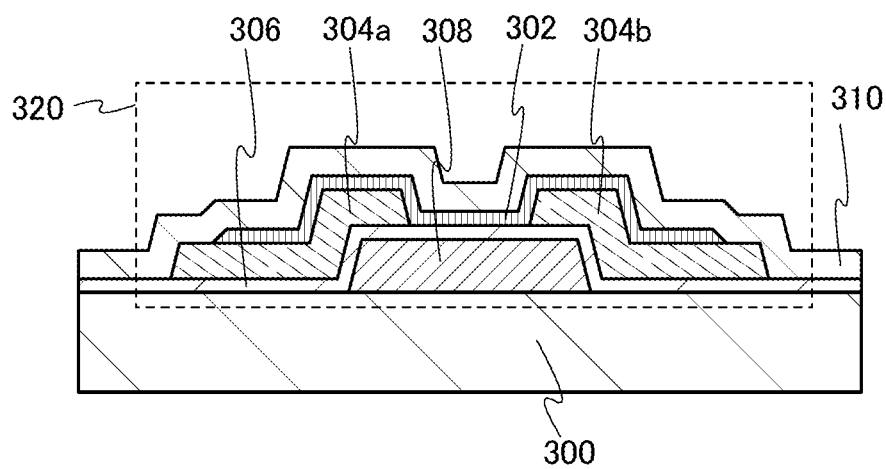

In FIGS. 3A to 3D, the method for manufacturing the top-contact forward staggered transistor, in which the source electrode (or drain electrode) 304a and the drain electrode (or source electrode) 304b are provided over and in contact with the oxide semiconductor layer 302, is illustrated as an example; however, the structure of the OS transistor in this embodiment is not limited to the structure. For example, a bottom-contact forward staggered transistor as illustrated in FIG. 4A, a top-contact inverted staggered transistor as illustrated in FIG. 4B, or a bottom-contact inverted staggered transistor may also be employed.

Figure 12A:
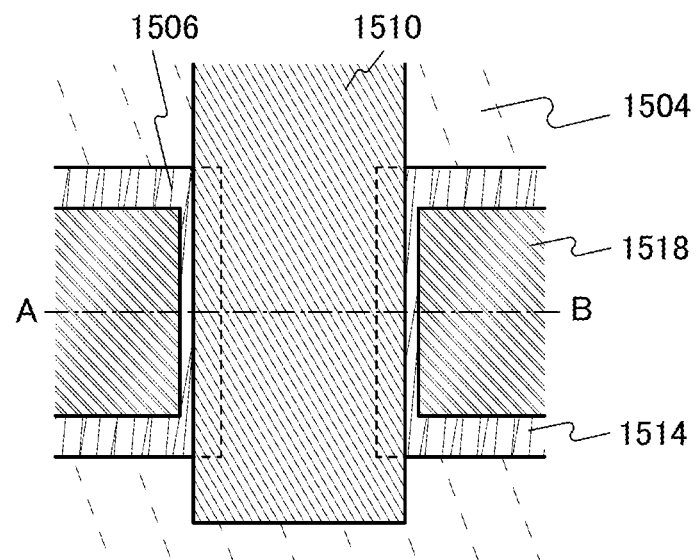
FIGS. 12A and 12B illustrate a structure of an OS transistor according to an embodiment of the present invention.
Figure 12B:
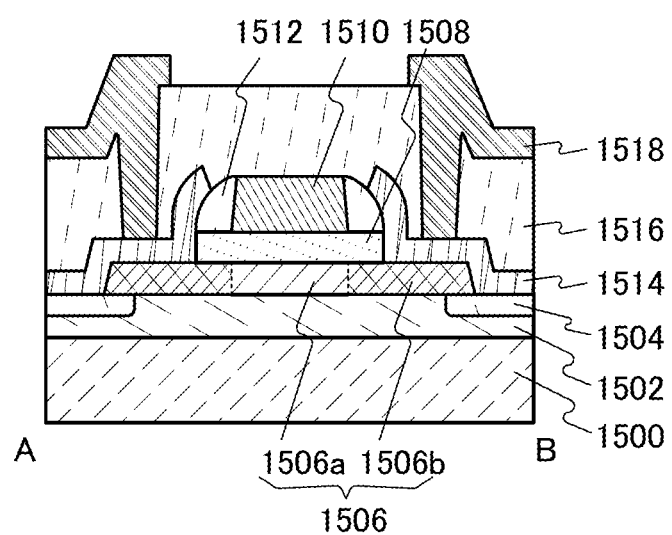

The OS transistor that can be applied to the first transistor 100 and the switching element 140 in this embodiment may be of a coplanar type as illustrated in FIGS. 12A and 12B. FIGS. 12A and 12B are a top view and a cross-sectional view of a coplanar transistor having a top-gate top-contact structure. FIG. 12A is the top view of the transistor. FIG. 12B illustrates cross section A-B along dashed-dotted line A-B in FIG. 12A.

The transistor illustrated in FIG. 12B includes a substrate 1500; a base insulating layer 1502 provided over the substrate 1500; a protective insulating layer 1504 provided in the periphery of the base insulating layer 1502; an oxide semiconductor film 1506 provided over the base insulating film 1502 and the protective insulating layer 1504 and including a high-resistance region 1506a and low-resistance regions 1506b; a gate insulating layer 1508 provided over the oxide semiconductor layer 1506; a gate electrode 1510 provided to overlap with the oxide semiconductor layer 1506 with the gate insulating layer 1508 positioned therebetween; a sidewall insulating layer 1512 provided in contact with a side surface of the gate electrode 1510; a pair of electrodes 1514 provided in contact with at least the low-resistance regions 1506b; an interlayer insulating layer 1516 provided to cover at least the oxide semiconductor layer 1506, the gate electrode 1510, and the pair of electrodes 1514; and a wiring 1518 provided to be connected to at least one of the pair of electrodes 1514 through an opening formed in the interlayer insulating layer 1516.

For the oxide semiconductor layer 1506 of the coplanar transistor in FIGS. 12A and 12B, any of the same materials that can be used for the oxide semiconductor layer 302 described in the above embodiment can be used. The other components may be formed as appropriate using known techniques and known materials.

Although not illustrated, a protective film may be provided to cover the interlayer insulating layer 1516 and the wiring 1518. With the protective film, a minute amount of leak current generated by surface conduction of the interlayer insulating layer 1516 can be reduced and thus the off-state current of the transistor can be reduced.

The OS transistor manufactured in this embodiment has an extremely small off-state current and a high field-effect mobility. The actually measured field-effect mobility of an insulated gate transistor can be lower than its original field-effect mobility because of a variety of reasons; this phenomenon occurs not only in the case of using the oxide semiconductor used in this embodiment. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility of a semiconductor itself and the measured field-effect mobility are $\mu_0$ and $\mu$, respectively, and a potential barrier (such as a grain boundary) exists in a semiconductor, the measured field-effect mobility can be expressed as the following formula.

$$\mu = \mu_0 \exp\left(-\frac{E}{kT}\right) \quad [\text{FORMULA 2}]$$

Here, E represents the height of the potential barrier, k represents the Boltzmann constant, and T represents the absolute temperature. When the potential barrier is assumed to be attributed to a defect, the height of the potential barrier can be expressed as the following formula according to the Levinson model.

$$E = \frac{e^2 N^2}{8 \varepsilon n} = \frac{e^3 N^2 t}{8 \varepsilon C_{ox} V_g} \quad [\text{FORMULA 3}]$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following formula.

$$I_d = \frac{W \mu V_g V_d C_{ox}}{L} \exp\left(-\frac{E}{kT}\right) \quad [\text{FORMULA 4}]$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \quad [\text{FORMULA 5}]$$
$$\ln\left(\frac{W \mu V_d C_{ox}}{L}\right) - \frac{E}{kT} = \ln\left(\frac{W \mu V_d C_{ox}}{L}\right) - \frac{e^3 N^2 t}{8 k T \varepsilon C_{ox} V_g}$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$–$V_g$ characteristics of the transistor. The defect density N of an oxide semiconductor in which the ratio of indium (In) to tin (Sn) and zinc(Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Formula 2 and Formula 3. The measured mobility of an In—Sn—Zn oxide including a defect is approximately 40 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator can be expressed as the following formula.

$$\frac{1}{\mu_1} = \frac{1}{\mu_0} + \frac{D}{B}\exp\left(-\frac{x}{l}\right) \qquad \text{[FORMULA 6]}$$

Here, D represents the electric field in the gate direction, and B and l are constants. B and l can be obtained from actual measurement results; according to the above measurement results, B is 4.75×10$^7$ cm/s and/is 10 nm (the depth to which the influence of interface scattering reaches). When D is increased (i.e., when the gate voltage is increased), the second term of Formula 6 is increased and accordingly the mobility $\mu_1$ is decreased.

Figure 7:
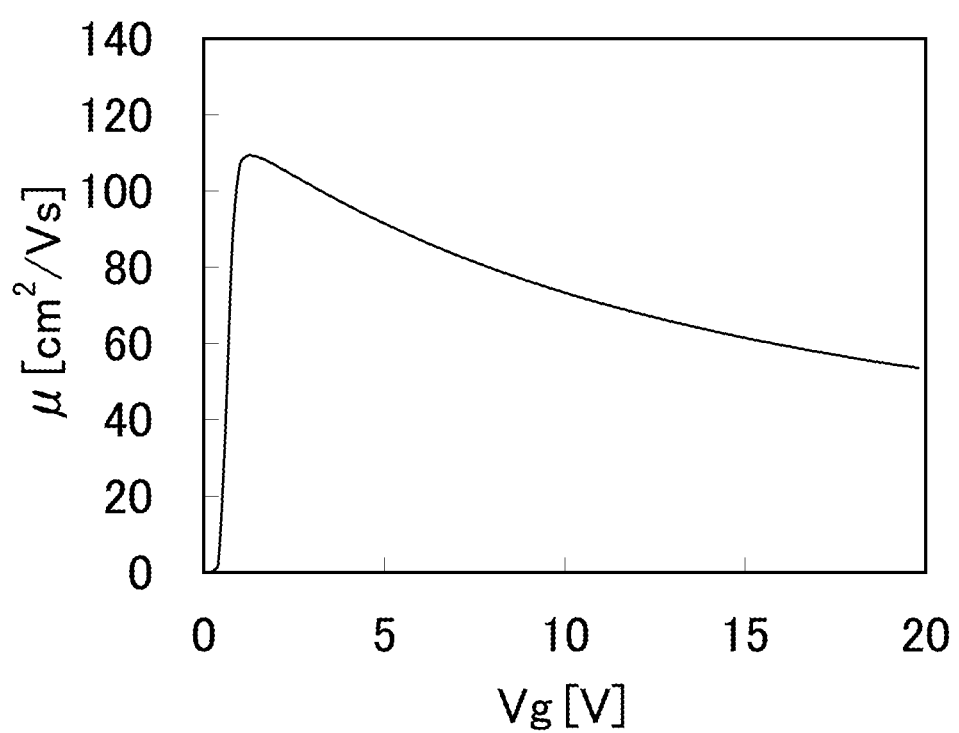
FIG. 7 shows the gate voltage dependence of mobility obtained by calculation.

Calculation results of the mobility $\mu_2$ of a transistor whose channel includes an ideal oxide semiconductor without a defect inside the semiconductor are shown in FIG. 7. For the calculation, software manufactured by Synopsys, Inc., Sentaurus Device, was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 7, the mobility has a peak of more than 100 cm$^2$/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 8A to 8C, FIGS. 9A to 9C, and FIGS. 10A to 10C. FIGS. 11A and 11B illustrate cross-sectional structures of the transistors used for the calculation. The transistors illustrated in FIGS. 11A and 11B each include a semiconductor region 1403a and a semiconductor region 1403c which have n$^+$-type conductivity in an oxide semiconductor layer. The resistivities of the semiconductor region 1403a and the semiconductor region 1403c are 2×10$^{-3}$ Ωcm.

The transistor illustrated in FIG. 11A is formed over a base insulating layer 1401 and an embedded insulating layer 1402 which is embedded in the base insulating layer 1401 and formed of aluminum oxide. The transistor includes the semiconductor region 1403a, the semiconductor region 1403c, an intrinsic semiconductor region 1403b serving as a channel formation region therebetween, and a gate electrode 1405. The width of the gate electrode 1405 is 33 nm.

A gate insulating layer 1404 is formed between the gate electrode 1405 and the semiconductor region 1403b. In addition, a sidewall insulating layer 1406a and a sidewall insulating layer 1406b are formed on both side surfaces of the gate electrode 1405, and an insulator 1407 is formed over the gate electrode 1405 so as to prevent a short circuit between the gate electrode 1405 and another wiring. The sidewall insulating layer has a width of 5 nm. A source 1408a and a drain 1408b are provided in contact with the semiconductor region 1403a and the semiconductor region 1403c, respectively. Note that the channel width of this transistor is 40 nm.

The transistor of FIG. 11B is the same as the transistor of FIG. 11A in that it is formed over the base insulating layer 1401 and the embedded insulating layer 1402 formed of aluminum oxide and that it includes the semiconductor region 1403a, the semiconductor region 1403c, the intrinsic semiconductor region 1403b provided therebetween, the gate electrode 1405 having a width of 33 nm, the gate insulating layer 1404, the sidewall insulating layer 1406a, the sidewall insulating layer 1406b, the insulator 1407, the source 1408a, and the drain 1408b.

The transistor illustrated in FIG. 11A is different from the transistor illustrated in FIG. 11B in the conductivity type of semiconductor regions under the sidewall insulating layer 1406a and the sidewall insulating layer 1406b. In the transistor illustrated in FIG. 11A, the semiconductor regions under the sidewall insulating layer 1406a and the sidewall insulating layer 1406b are part of the semiconductor region 1403a having n$^+$-type conductivity and part of the semiconductor region 1403c having n$^+$-type conductivity, whereas in the transistor illustrated in FIG. 11B, the semiconductor regions under the sidewall insulating layer 1406a and the sidewall insulating layer 1406b are part of the intrinsic semiconductor region 1403b. In other words, a region having a width of $L_{off}$ which overlaps with neither the semiconductor region 1403a (the semiconductor region 1403c) nor the gate electrode 1405 is provided. This region is called an offset region, and the width $L_{off}$ is called an offset length. As is seen from the drawing, the offset length is equal to the width of the sidewall insulating layer 1406a (the sidewall insulating layer 1406b).

Figure 8A:
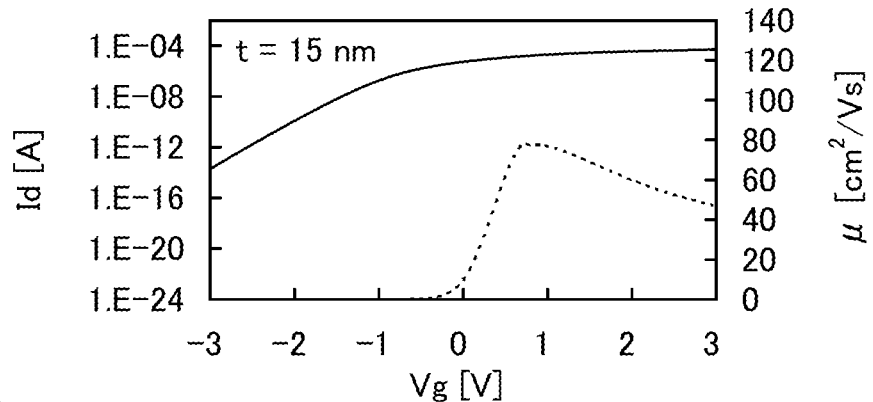
FIGS. 8A to 8C show the gate voltage dependence of drain current and mobility obtained by calculation.
Figure 8B:
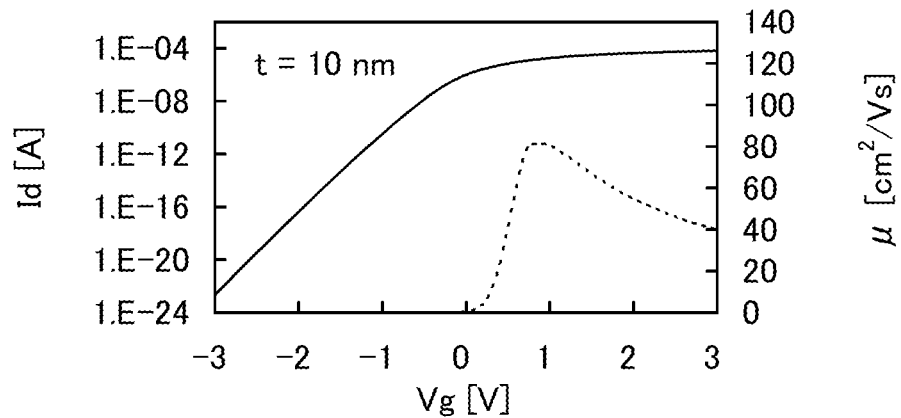
Figure 8C:
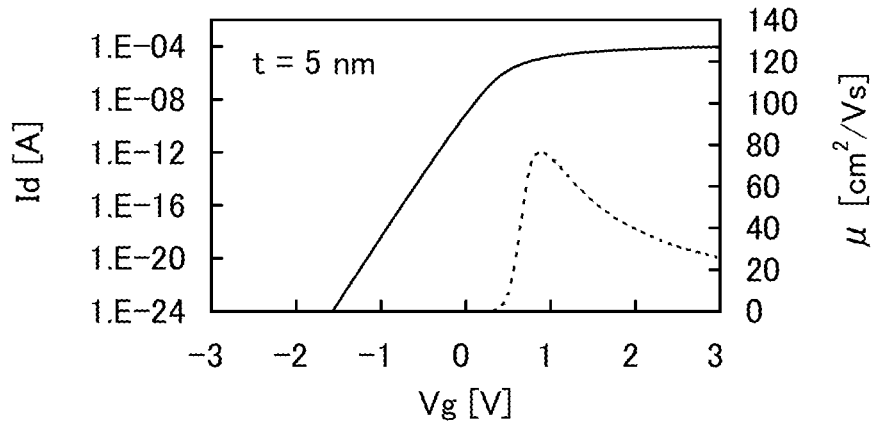

The other parameters used in calculation are as described above. For the calculation, software manufactured by Synopsys, Inc., Sentaurus Device, was used. FIGS. 8A to 8C show the gate voltage ($V_g$: a potential difference between the gate and the source) dependence of the drain current ($I_d$, a solid line) and the mobility (μ, a dotted line) of the transistor having the structure illustrated in FIG. 11A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 8A shows the gate voltage dependence of the transistor in the case where the thickness of the gate insulating film is 15 nm, FIG. 8B shows that of the transistor in the case where the thickness of the gate insulating film is 10 nm, and FIG. 8C shows that of the transistor in the case where the thickness of the gate insulating film is 5 nm. As the gate insulating film is thinner, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 9A:
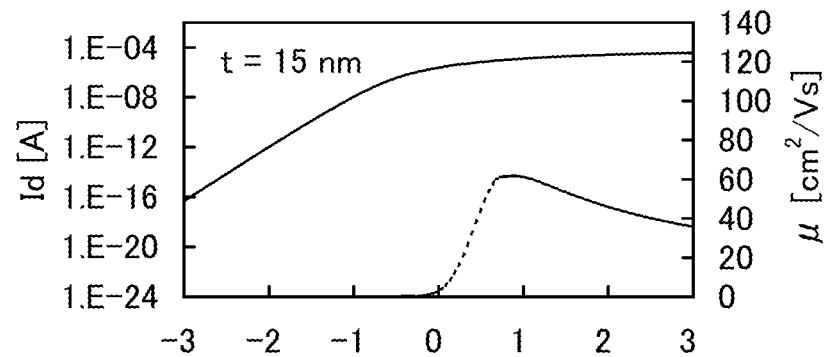
FIGS. 9A to 9C show the gate voltage dependence of drain current and mobility obtained by calculation.
Figure 9B:
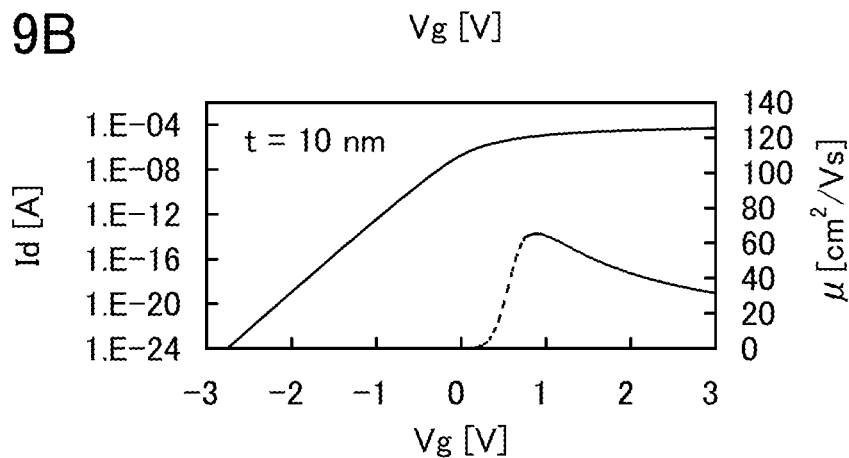
Figure 9C:
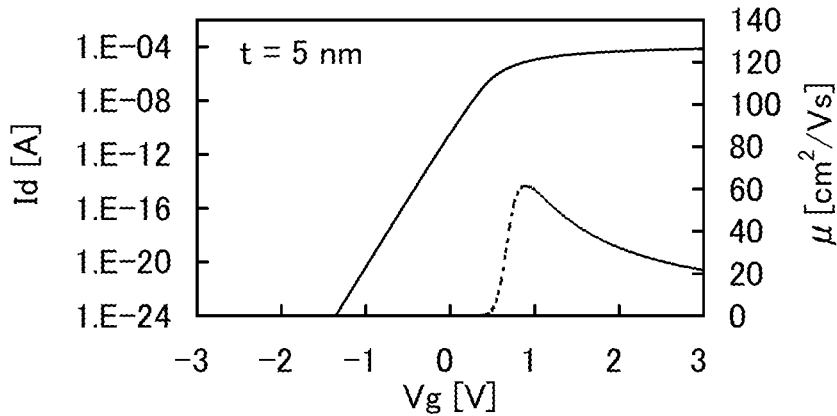

FIGS. 9A to 9C show the gate voltage $V_g$ dependence of the drain current $I_d$ (a solid line) and the mobility μ (a dotted line) of the transistor having the structure illustrated in FIG. 11B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 9A shows the gate voltage dependence of the transistor in the case where the thickness of the gate insulating film is 15 nm, FIG. 9B shows that of the transistor in the case where the thickness of the gate insulating film is 10 nm, and FIG. 9C shows that of the transistor in the case where the thickness of the gate insulating film is 5 nm.

Figure 10A:
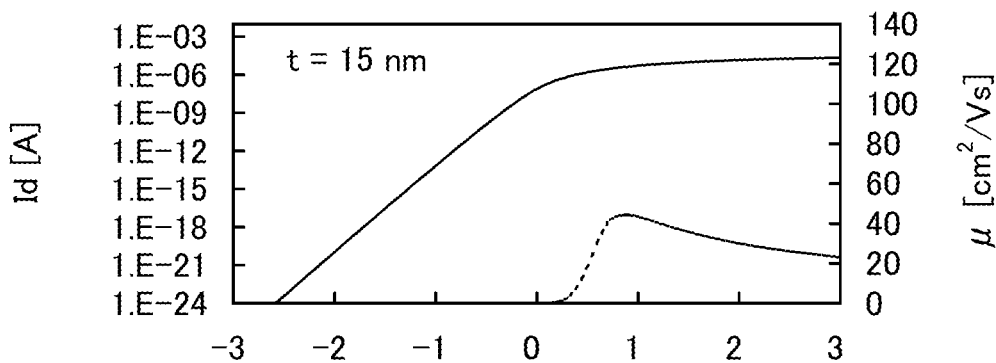
FIGS. 10A to 10C show the gate voltage dependence of drain current and mobility obtained by calculation.
Figure 10B:
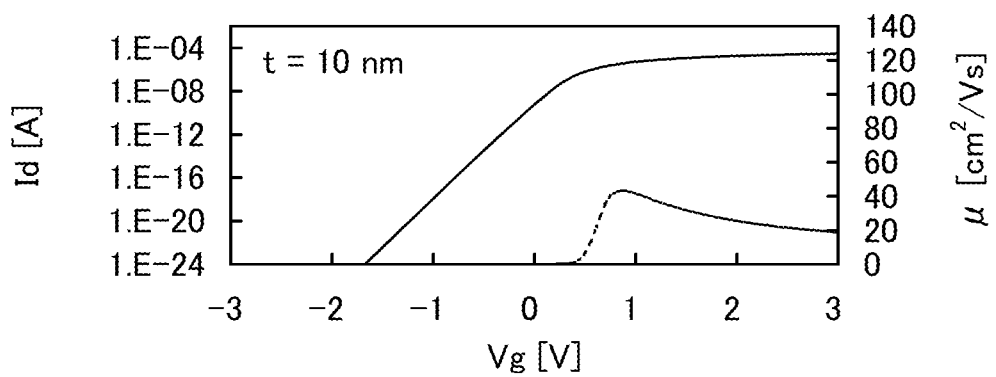
Figure 10C:
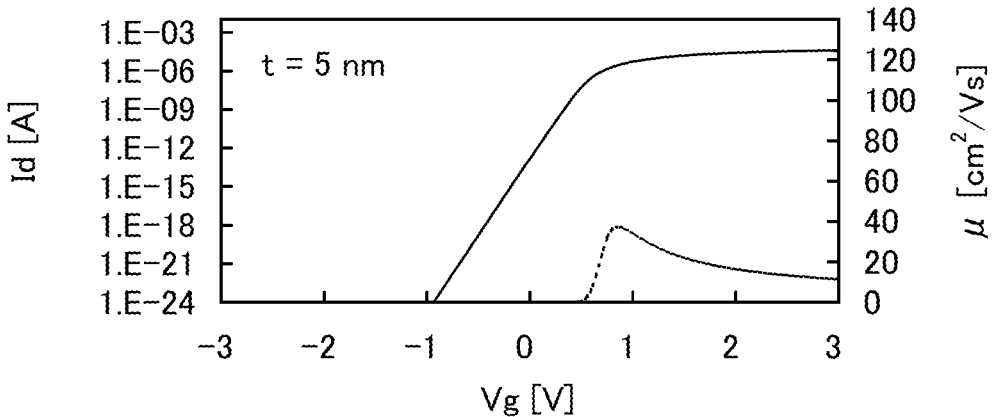
Figure 11A:
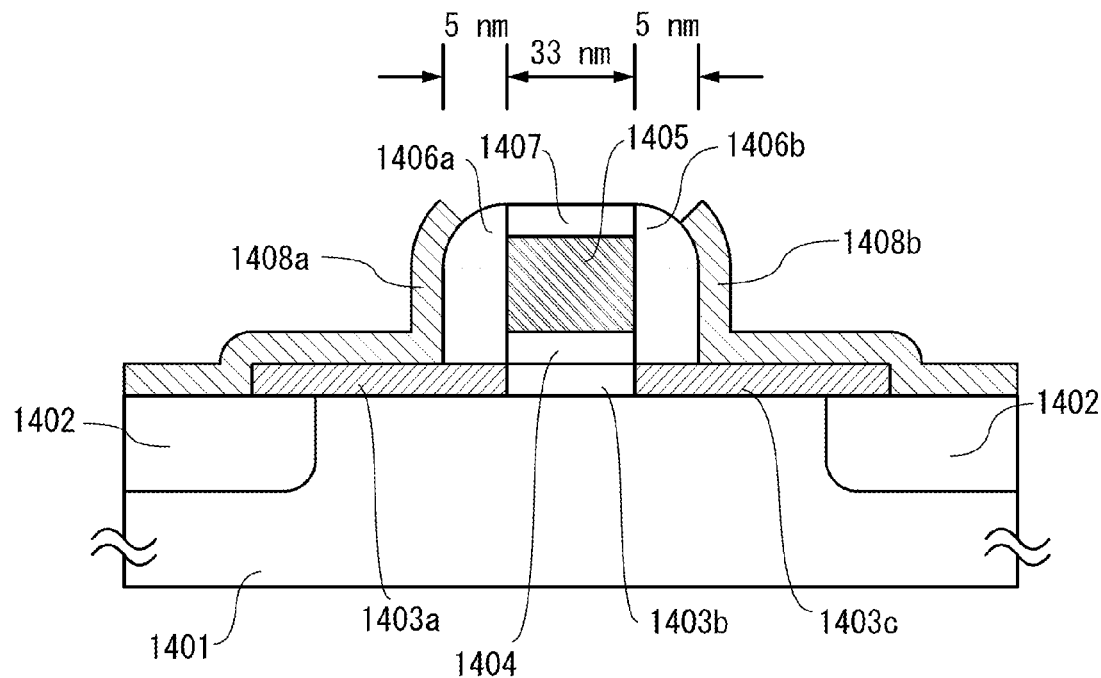
FIGS. 11A and 11B illustrate cross-sectional structures of transistors which are used in calculation.
Figure 11B:
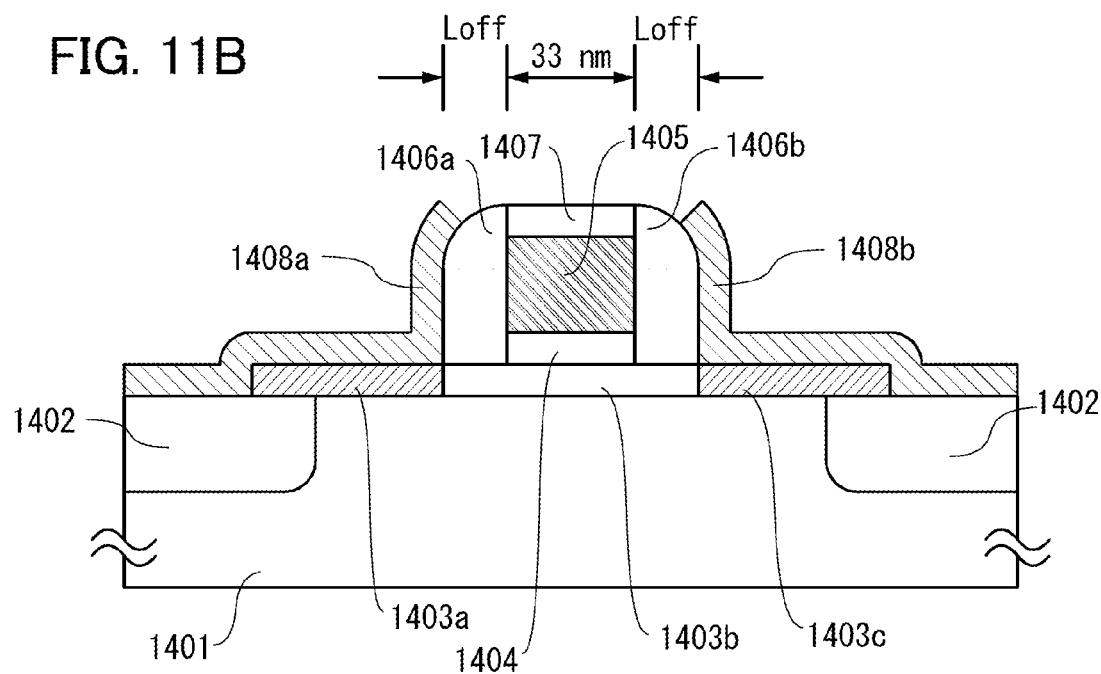

Further, FIGS. 10A to 10C show the gate voltage dependence of the drain current $I_d$ (a solid line) and the mobility μ (a dotted line) of the transistor having the structure illustrated in FIG. 11B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. FIG. 10A shows the gate voltage dependence of the transistor in the case where the thickness of the gate insulating film is 15 nm, FIG. 10B shows that of the transistor in the case where the thickness of the gate insulating film is 10 nm, and FIG. 10C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 8A to 8C, approximately 60 cm²/Vs in FIGS. 9A to 9C, and approximately 40 cm²/Vs in FIGS. 10A to 10C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V.

The above is description of the method for manufacturing the OS transistor that can be applied to the first transistor 100 and the switching element 140 described in the above embodiment and characteristics of the OS transistor.

(Embodiment 4)

In this embodiment, a CAAC-OS (c-axis aligned crystalline oxide semiconductor) film will be described.

The CAAC-OS film is not completely single crystal nor completely amorphous. The CAAC-OS film is an oxide semiconductor film with a crystal-amorphous mixed phase structure where crystal parts (or crystal regions) and amorphous parts (or amorphous regions) are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor layer is higher than that in the vicinity of the surface where the oxide semiconductor layer is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

Embodiment (5)

In this embodiment, electronic devices to which the memory device described in the above embodiment is applied will be described with reference to FIGS. 6A to 6D. In this embodiment, application examples of the above-described semiconductor device to electronic devices such as a portable information terminal (including a mobile phone, a portable game machine, an audio reproducing device, and the like), an electronic paper, a television device (also referred to as a television or a television receiver), and a digital camera will be described.

FIG. 6A illustrates a portable information terminal, which includes a housing 901, a housing 902, a first display portion 903a, a second display portion 903b, and the like. The semiconductor device described in the above embodiment is provided inside at least one of the housings 901 and 902. Therefore, a laptop personal computer in which writing and reading of data are fast, data is stored for a long time, and power consumption is sufficiently reduced can be realized. At least one of the housings 901 and 902 is provided with the semiconductor device described in the above embodiment. Therefore, an e-book reader in which writing and reading of data are fast, data is stored for a long time, and power consumption is sufficiently reduced can be realized.

The first display portion 903a and the second display portion 903b each function as a panel having a touch-input function, and an input method can be selected using selection buttons 904 displayed on the first display portion 903a, as illustrated in a left part of FIG. 6A, for example. Since the selection buttons with a variety of sizes can be displayed, the portable information terminal can be easily used by people of any generation. In the case where "keyboard input" is selected for example, a keyboard 905 is displayed on the first display portion 903a as illustrated in a right part of FIG. 6A. With the keyboard 905, letters can be input quickly by keyboard input as in the case of using a conventional information terminal, for example.

In the portable information terminal illustrated in FIG. 6A, the housing 901 provided with the first display portion 903a and the housing 902 provided with the second display portion 903b can be separated as in the right part of FIG. 6A. Thus, the portable information terminal can be used as a lighter portable information terminal by detaching one of the housing 901 and the housing 902 as necessary.

The portable information terminal illustrated in FIG. 6A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 6A may be configured to be able to transmit and receive data wirelessly. Through wireless communication, desired book data or the like can be purchased and downloaded from an electronic book server.

Further, the housing 902 illustrated in FIG. 6A may be equipped with an antenna, a microphone function, or a wireless communication function to be used as a mobile phone.

FIG. 6B illustrates an electronic book reader in which electronic paper is incorporated. The electronic book reader has two housings of a housing 911 and a housing 912. The housing 911 and a housing 912 are provided with a display portion 913 and a display portion 914 respectively. The housings 911 and 912 are connected by a hinge portion 915 and can be opened or closed with the hinge portion 915 as an axis. The housing 911 is provided with a power switch 916, an operation key 917, a speaker 918, and the like. At least one of the housing 911 and the housing 912 is provided with the semiconductor device described in the above embodiment. Therefore, an e-book reader in which writing and reading of data are fast, data is stored for a long time, and power consumption is sufficiently reduced can be realized.

FIG. 6C is a television device including a housing 921, a display portion 922, a stand 923, and the like. The television device can be operated with a switch of the housing 921 and a separate remote controller 924. The semiconductor device described in the above embodiment is mounted in the housing 921 and the remote controller 924. Therefore, a television device in which writing and reading of data are fast, data is stored for a long time, and power consumption is sufficiently reduced can be realized.

FIG. 6D illustrates a digital camera including a main body 931, an operation switch 932, a battery 933, and the like. Further, the digital camera is provided with a display portion (not illustrated but positioned on the back surface of the main body) and the like on its back surface. In the main body 931, the semiconductor device described in the above embodiment is provided. Therefore, a digital camera in which writing and reading of data are fast, data is stored for a long time, and power consumption is sufficiently reduced can be realized.

As described above, the semiconductor device described in the above embodiment is incorporated in the electronic devices described in this embodiment. Therefore, electronic devices with low power consumption can be obtained.

This application is based on Japanese Patent Application serial no. 2011-108767 filed with Japan Patent Office on May 13, 2011, the entire contents of which are hereby incorporated by reference.

What is claimed is:

1. A semiconductor device comprising:
    a holding circuit comprising a first transistor and a capacitor electrically connected to the first transistor;
    a comparison circuit comprising:
        a first arithmetic circuit comprising a second transistor and a third transistor electrically connected to the second transistor; and
        a second arithmetic circuit comprising a fourth transistor and a fifth transistor electrically connected to the fourth transistor; and
    a switching element,
    wherein the first transistor includes a first oxide semiconductor layer,
    wherein the holding circuit is electrically connected to the first arithmetic circuit and the second arithmetic circuit,
    wherein the first arithmetic circuit is electrically connected to the second arithmetic circuit,
    wherein the switching element is electrically connected to the first arithmetic circuit and the second arithmetic circuit,
    wherein the first arithmetic circuit and the second arithmetic circuit are configured to change a potential of a output signal line electrically connected to the switching element, and
    wherein one of a source electrode and a drain electrode of the first transistor is electrically connected to the capacitor, a gate electrode of the third transistor, and a gate electrode of the fifth transistor.

2. The semiconductor device according to claim 1, wherein the switching element is a transistor including a second oxide semiconductor layer.

3. The semiconductor device according to claim 1, wherein the first oxide semiconductor layer comprises at least one of indium and zinc.

4. The semiconductor device according to claim 1, wherein the third transistor has a different channel conductivity type from the second transistor.

5. The semiconductor device according to claim 1, wherein the fifth transistor has a different channel conductivity type from the fourth transistor.

6. The semiconductor device according to claim 1, wherein third transistor has a different channel conductivity type from the fifth transistor.

7. The semiconductor device according to claim 1, wherein a gate electrode of the second transistor and a gate electrode of the fourth transistor are electrically connected to an input signal line.

8. The semiconductor device according to claim 1,
    wherein one of a source electrode and a drain electrode of the second transistor and one of a source electrode and a drain electrode of the fourth transistor are electrically connected to the switching element,
    wherein the other of the source electrode and the drain electrode of the second transistor is electrically connected to the third transistor, and
    wherein the other of the source electrode and the drain electrode of the fourth transistor is electrically connected to the fifth transistor.

9. A memory device comprising the semiconductor device according to claim 1, wherein a plurality of the semiconductor devices are arranged in a matrix.

10. The memory device according to claim 9 further comprising:
a detection circuit configured to detect a change in the potential of the output signal line in at least one of the plurality of the semiconductor devices,
wherein the detection circuit outputs a first signal when the change in the potential is detected by the detection circuit, and
wherein the detection circuit outputs a second signal which is different from the first signal when the change in the potential is not detected by the detection circuit.

11. A semiconductor device comprising:
a holding circuit comprising a first transistor and a capacitor electrically connected to the first transistor, wherein storage data is input to the capacitor;
a comparison circuit comprising:
a first arithmetic circuit comprising a second transistor and a third transistor electrically connected to the second transistor; and
a second arithmetic circuit comprising a fourth transistor and a fifth transistor electrically connected to the fourth transistor; and
a switching element,
wherein reference data is input to each of the first arithmetic circuit and the second arithmetic circuit so that the first arithmetic circuit and the second arithmetic circuit each compares the storage data with the reference data,
wherein the first transistor includes a first oxide semiconductor layer,
wherein the holding circuit is electrically connected to the first arithmetic circuit and the second arithmetic circuit,
wherein the first arithmetic circuit is electrically connected to the second arithmetic circuit,
wherein the switching element is electrically connected to the first arithmetic circuit and the second arithmetic circuit, and
wherein the first arithmetic circuit and the second arithmetic circuit is configured to change a potential of a output signal line electrically connected to the switching element when at least one of the first arithmetic circuit and the second arithmetic circuit and the switching element are in a conductive state, and
wherein one of the source electrode and the drain electrode of the first transistor is electrically connected to the capacitor, a gate electrode of the third transistor, and a gate electrode of the fifth transistor.

12. The semiconductor device according to claim 11, wherein the switching element is a transistor including a second oxide semiconductor layer.

13. The semiconductor device according to claim 11, wherein the first oxide semiconductor layer comprises at least one of indium and zinc.

14. The semiconductor device according to claim 11, wherein the third transistor has a different channel conductivity type from the second transistor.

15. The semiconductor device according to claim 11, wherein the fifth transistor has a different channel conductivity type from the fourth transistor.

16. The semiconductor device according to claim 11, wherein the third transistor has a different channel conductivity type from the fifth transistor.

17. The semiconductor device according to claim 11, wherein a gate electrode of the second transistor and a gate electrode of the fourth transistor are electrically connected to an input signal line.

18. The semiconductor device according to claim 11,
wherein one of a source electrode and a drain electrode of the second transistor and one of a source electrode and a drain electrode of the fourth transistor are electrically connected to the switching element,
wherein the other of the source electrode and the drain electrode of the second transistor is electrically connected to the third transistor, and
wherein the other of the source electrode and the drain electrode of the fourth transistor is electrically connected to the fifth transistor.

19. A memory device comprising the semiconductor device according to claim 11, wherein a plurality of the semiconductor devices are arranged in a matrix.

20. The memory device according to claim 19 further comprising:
a detection circuit configured to detect a change in the potential of the output signal line in at least one of the plurality of the semiconductor devices,
wherein the detection circuit outputs a first signal when the change in the potential is detected by the detection circuit, and
wherein the detection circuit outputs a second signal which is different from the first signal when the change in the potential is not detected by the detection circuit.

21. The semiconductor device according to claim 11, wherein a third signal is output to the output signal line when at least one of the first arithmetic circuit and the second arithmetic circuit and the switching element are in a conductive state.

* * * * *

UNITED STATES PATENT AND TRADEMARK OFFICE
CERTIFICATE OF CORRECTION

PATENT NO. : 8,897,049 B2  
APPLICATION NO. : 13/467269  
DATED : November 25, 2014  
INVENTOR(S) : Kazuma Furutani Page 1 of 1

It is certified that error appears in the above-identified patent and that said Letters Patent is hereby corrected as shown below:

In the Specification

Column 8, line 49, replace "x" with -- × --;

Column 9, line 53, replace "x" with -- × --;

Column 9, line 66, replace "x" with -- × --;

Column 9, line 67, replace "x" with -- × --;

Column 25, line 22, replace both instances of "1" with -- $l$ --;

Column 25, line 24, replace "and/is" with -- and $l$ is --; and

In the Claims

Column 30, line 50, Claim 6, after "wherein" add -- the --.

Signed and Sealed this  
Twenty-fourth Day of November, 2015

Michelle K. Lee  
*Director of the United States Patent and Trademark Office*